United States Patent [19]
Mandai et al.

[11] Patent Number: 5,744,379
[45] Date of Patent: Apr. 28, 1998

[54] SEMICONDUCTOR DEVICE COMPOSED OF PLURAL SEMICONDUCTOR CHIPS AND COUPLING MEANS WHICH COUPLE THE SEMICONDUCTOR CHIPS TOGETHER

[75] Inventors: Masaaki Mandai; Hitoshi Takeuchi; Yutaka Saito; Tomoyuki Yoshino, all of Tokyo, Japan

[73] Assignee: Seiko Instruments, Inc., Tokyo, Japan

[21] Appl. No.: 491,581

[22] Filed: Jun. 6, 1995

Related U.S. Application Data

[62] Division of Ser. No. 54,074, Apr. 27, 1993.

[30] Foreign Application Priority Data

| Apr. 27, 1992 | [JP] | Japan | 4-108159 |
| Oct. 22, 1992 | [JP] | Japan | 4-284666 |
| Nov. 6, 1992 | [JP] | Japan | 4-297193 |
| Nov. 10, 1992 | [JP] | Japan | 4-299650 |
| Feb. 18, 1993 | [JP] | Japan | 5-29493 |

[51] Int. Cl.⁶ .................................................. H01L 21/18
[52] U.S. Cl. .............................. 437/208; 437/915; 437/3; 437/53
[58] Field of Search ........................... 437/208, 915, 437/3, 53

[56] References Cited

U.S. PATENT DOCUMENTS

| 3,769,702 | 11/1973 | Scarbrough | 437/208 |
| 4,137,625 | 2/1979 | White | 437/53 |
| 4,214,264 | 7/1980 | Hayward et al. | 257/226 |
| 4,660,066 | 4/1987 | Reid | 257/777 |
| 4,668,333 | 5/1987 | Tandon et al. | 437/53 |
| 4,794,092 | 12/1988 | Solomon | 437/915 |
| 4,870,293 | 9/1989 | Elabd | 257/232 |
| 4,899,185 | 2/1990 | Newman . | |
| 5,043,296 | 8/1991 | Hacke et al. | 473/51 |
| 5,059,557 | 10/1991 | Cragon et al. | 437/208 |
| 5,070,026 | 12/1991 | Greenwald et al. | 437/915 |
| 5,079,189 | 1/1992 | Drake et al. | 437/53 |
| 5,120,665 | 6/1992 | Tsukagoshi et al. | 437/8 |
| 5,162,251 | 11/1992 | Poole et al. | 437/53 |
| 5,198,888 | 3/1993 | Sugano et al. | 437/208 |
| 5,220,210 | 6/1993 | Miwada | 257/445 |
| 5,296,043 | 3/1994 | Kawakami et al. | 437/51 |
| 5,481,436 | 1/1996 | Werther | 437/915 |

*Primary Examiner*—John Niebling
*Assistant Examiner*—Kevin F. Turner
*Attorney, Agent, or Firm*—Loeb & Loeb LLP

[57] ABSTRACT

The semiconductor image sensor device of the multiple chip mount type is constructed such that electrical and mechanical connections are carried out concurrently among chips. Coupling chips 4 are utilized to couple a plurality of semiconductor image sensor chips 1 with each other, and the couple one semiconductor image sensor chip 1 to a driver substrate 3 which mounts thereon a semiconductor driving chip 2 for driving the semiconductor image sensor chips 1.

10 Claims, 18 Drawing Sheets

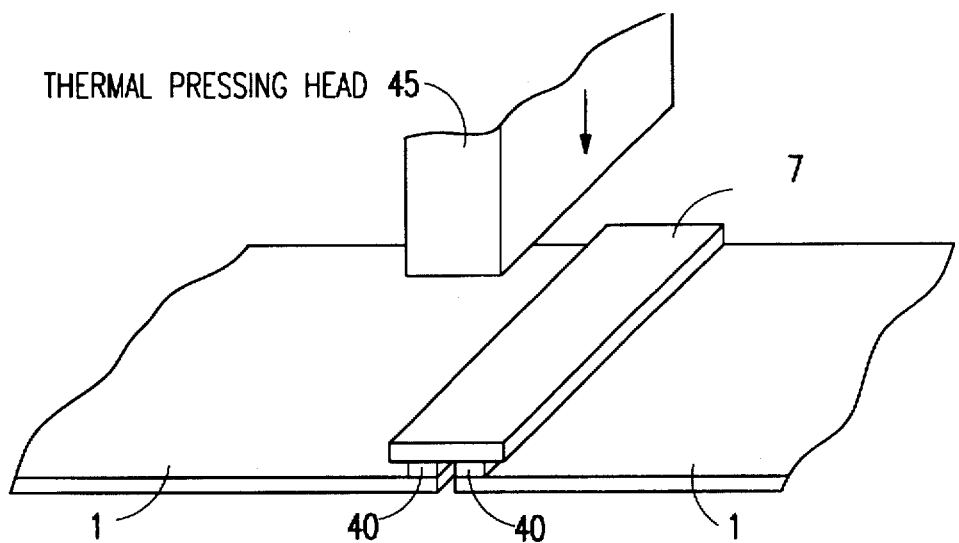
FIG. 24
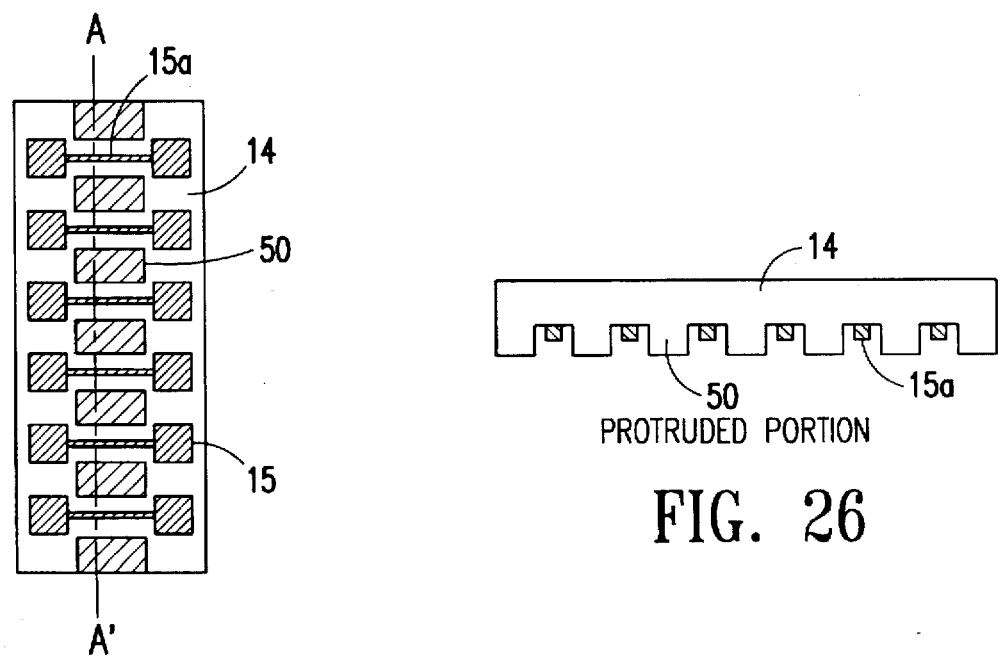
FIG. 25
FIG. 26

SEMICONDUCTOR DEVICE COMPOSED OF PLURAL SEMICONDUCTOR CHIPS AND COUPLING MEANS WHICH COUPLE THE SEMICONDUCTOR CHIPS TOGETHER

This is a division of application Ser. No. 08/054,074, filed on Apr. 27, 1993.

BACKGROUND OF THE INVENTION

The present invention relates to a semiconductor device having a plurality of semiconductor chips such as a computer, a semiconductor image sensor device and the like, and particularly to a semiconductor image sensor device utilized for detecting not only visible light, infrared rays and ultraviolet rays, but also X-rays, radioactive rays and charged particles. The semiconductor image sensor device refers to various semiconductor integrated circuit devices including photodiodes, photodiode arrays, photosensors, microstrip sensors, two-face microstrip sensors, radioactive sensors, semiconductor photosensors, and semiconductor imaging devices. The term "detecting" means production of a signal upon receiving of such light rays and radioactive rays. An element or a portion of a detection area is referred to as a "photosensor" or a "light receiving area". Further, the term "image sensor device" refers to a device composed of an arrangement of photosensors for producing two-dimensional image information according to detected signals from the photosensors. Such a type of device may be composed of a single photosensor chip for performing a certain function. However, the present invention particularly relates to a specific construction of the type composed of a plurality of sensor chips mechanically and electrically integrated with each other to function as the semiconductor image sensor device, as a whole. Hereinafter, such an integrated construction will be referred to as a "semiconductor image sensor device of the multiple chip mount type".

FIGS. 41 and 42 show such a type of conventional structure. In the prior art, as shown in FIG. 41, the sensor device is comprised of four pieces of semiconductor-image sensor chips 1, and two pieces of driver substrates 3 for controlling the sensor chips 1 to retrieve a signal. As shown in FIG. 42, these sensor chips 1 and driver substrates 3 are united with each other at the bottom by means of a one piece support member 76. In this conventional structure, electrical connection is provided by means of bonding wires 73 among the semiconductor image sensor chips 1 and driver substrates 3. In addition, each sensor chip 1 is formed with sensing lines 5 and corresponding pad electrodes 75 for wire bonding. Each driver substrate 3 is provided with a semiconductor driving chip 2 and pad electrodes 74 for wire bonding. Though not shown in the figures, the driving chip 2 and the driver substrate 3 are wire-bonded.

Though FIG. 41 is illustratively simplified for facilitating understanding, actually, the semiconductor image sensor chip 1 has a size much greater than an ordinary semiconductor chip. For example, the sensor chip 1 has a length of 5–7 cm along the sensing line 5 and a width of 3 cm. The sensor chip 1 practically contains about 600 sensing lines 5 (only 6 of the sensing lines 5 are illustrated in FIG. 41) aligned at a pitch of about 50 μm. Thus, the FIG. 41 device has an entire length of 30 cm and a width of 3 cm.

As mentioned above, in the conventional semiconductor image sensor device of the multiple chip mount type, separate means are provided at the top and bottom sides for mechanical unification of the multiple chips and circuit substrates with each other, and for electrical connection to constitute a system. Such a construction raises the following various drawbacks. First, a mechanical support structure is necessarily required. Second, the mechanical support structure may affect the light receiving area to hinder the detection efficiency. Third, both mechanical coupling work and electrical connection work are needed to thereby prolong assembling time. Fourth, the electrical connection work by wire bonding may not be well conducted if the pad electrodes have an excessively narrow-pitch. Namely, during the wire bonding operation, an already coupled wire might be broken by a bonding tool. Fifth, even if the bonding operation is finished safely, inadvertent external force might be incidentally applied so that a wire is broken, or is contacted to an adjacent wire to cause a short circuit defect. Sixth, the mechanical rigidity solely depends on the support structure, thereby causing restriction of shaping and positioning of the support member.

Further, the internal pattern arrangement is restricted in the semiconductor driving chip 2 because of the need to leave a space for wire bonding. Namely, the driving chip 2 is provided with input terminals corresponding to each of the sensing lines or strip lines which are arranged at a close pitch with each other. Therefore, the pitch of the adjacent input terminals is also made close. In such a case, there could not be provided a sufficient space for forming an input single processing circuit (input buffer) which is located in the vicinity of the input terminals. Consequently, it is practically difficult to reduce the pitch of the input terminal arrangement.

SUMMARY OF THE INVENTION

In order to solve the above noted problems of the prior art, an object of the invention is to provide a semiconductor image sensor device of the multiple chip mount type, in which mechanical fixing and electrical connection are concurrently achieved without adversely affecting a light receiving area and while ensuring sufficient mechanical rigidity, and in which the stable electrical connection is ensured for sensing lines of the narrow pitch and the connection quality is stably maintained once the electrical connection work is completed.

According to the invention, in the semiconductor image sensor device of the multiple chip mount type, a specific component, i.e. a coupling chip, is utilized to couple an adjacent pair of semiconductor image sensor chips with each other, and to couple an adjacent pair of a semiconductor image sensor chip and a driver substrate. The specific component is composed of a solid piece such as a silicon chip or a glass chip which is formed thereon with lead lines and junction electrodes for electrical connection. The coupling chip is placed such that one face formed with the lead lines and junction electrodes is opposed to corresponding junction electrodes formed on the semiconductor image sensor chip. By such a mounting manner (hereinafter called "facedown" mounting), the mechanical fixing and electrical connection are concurrently effected to ensure stable coupling without affecting the light receiving area. Additionally, after facedown coupling of adjacent elements, supplementary electrical connection may be added to the coupled portion. Preferably, a semiconductor driving chip may be also mounted on the driver substrate by facedown bonding. Further, if a certain mechanical strength is required in the semiconductor image sensor device, a supplementary reinforcement member is provided to obtain a desired strength. Moreover, in case that the semiconductor image sensor device generates a considerable amount of heat during operation, a radiator plate may be added to remove the harmful heat.

The thus constructed semiconductor image sensor device of the multiple chip mount type has the following features. First, a mechanical support structure can be eliminated in contrast to the prior art structure in which the mechanical support member may affect the light receiving area to hinder the detection efficiency. Second, the mechanical fixing work and the electrical connecting work can be effected at once, and further the coupling is carried out by one step between the adjacent semiconductor image sensor chips and between a semiconductor image sensor chip and a driver substrate, thereby reducing the working time. Third, the coupling chip has the lead lines formed on the chip face by semiconductor process, hence the lead lines may not be broken or shorted during and after the coupling process. Further, the pattern density of the lead lines can be increased to enable narrow pitch connection, thereby increasing the density of sensing lines formed on the light receiving area of the semiconductor image sensor chip to improve the detection ability. Fourth, the semiconductor driving chip is mounted on the driver substrate by the facedown bonding, such that pads of input/output terminals can be arranged internally besides peripheral areas of the driving chip. Thus, freedom of the pad arrangement is significantly improved to thereby increase yield rate by enlarging the pad pitch and pad size, and to improve electric performance by optimizing characteristics of circuit elements due to increased freedom of the internal element arrangement. Fifth, after completing the coupling work, the lead lines and junction electrodes of the coupling chip and the corresponding junction electrodes of the sensor chip are concealed between the pair of coupling and sensor chips. Consequently, the coupled portion is not exposed externally to thereby maintain the coupling quality to improve the reliability. Sixth, if further mechanical strength is required, a reinforcement member is provided as a supplementary support structure, thereby improving the rigidity of the semiconductor image sensor device. The supplementary support reinforcement member may not have large size, and have freedom of positioning. Therefore, the reinforcement members can be attached to widthwise opposite sides of the semiconductor image sensor chips so as to eliminate adverse effects to the light receiving area. Seventh, the radiator plate can effectively prevent thermal damage of the semiconductor image sensor device during the course of operation. Eighth, in the sensing area, it is possible to reduce harmful effects during at sensing operation.

BRIEF DESCRIPTION OF THE DRAWINGS

FIG. 24 is a perspective view showing thermal pressing step of coupling a pair of semiconductor image sensor chips by means of a coupling chip.

FIG. 25 is a detailed plan view showing a glass coupling chip used in one embodiment of the inventive semiconductor image sensor device.

FIG. 26 is a sectional diagram of the FIG. 25 glass coupling chip, taken along the line A-A' of FIG. 25.

DETAILED DESCRIPTION OF EMBODIMENTS

Figure 1:
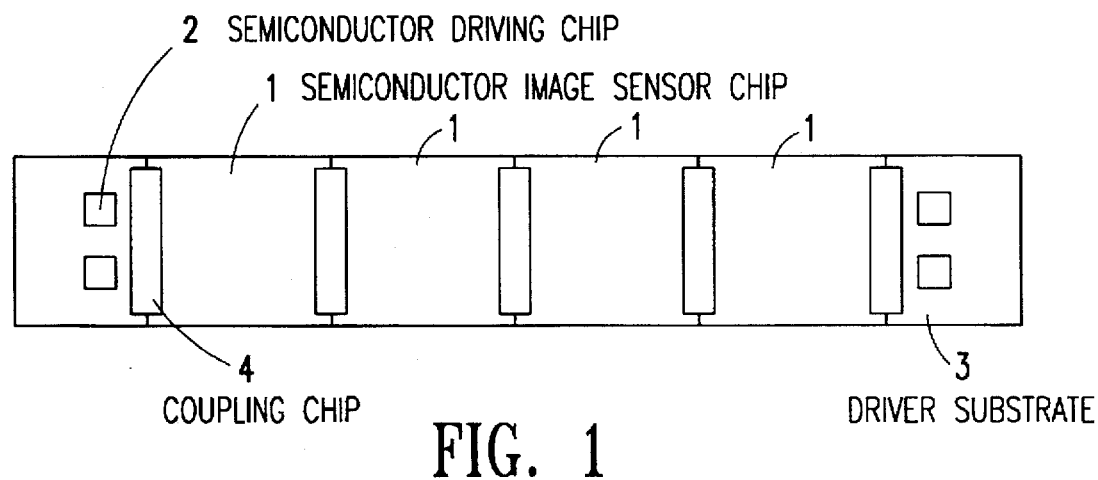
FIG. 1 is a top plan view showing one embodiment of the inventive semiconductor image sensor device.

Hereinafter, embodiments of the invention will be described in conjunction with the drawings. FIG. 1 is a top plan view showing one embodiment of the semiconductor image sensor device according to the invention. Four semiconductor image sensor chips 1 are aligned in precise positional relation with each other. An adjacent pair of sensor chips 1 are electrically and mechanically connected to one another by means of a coupling chip 4. A pair of driver substrates 3 are arranged adjacent to the semiconductor image sensor chips at respective ends of the row of sensor chips 1. These driver substrates 3 mount thereon semiconductor driving chips 2 for carrying out control of the four sensor chips 1 and retrieval of information from the sensor chips 1. Each of the semiconductor image sensor chips 1 is the main component of the semiconductor image sensor device, and is provided with junction electrodes (not shown in the figure) on its top and bottom faces at opposite end portions thereof spaced apart leftward and rightward in the figure, while the intermediate remaining portion constitutes a light receiving area or image sensing area on both of the top and bottom faces.

Figure 10:
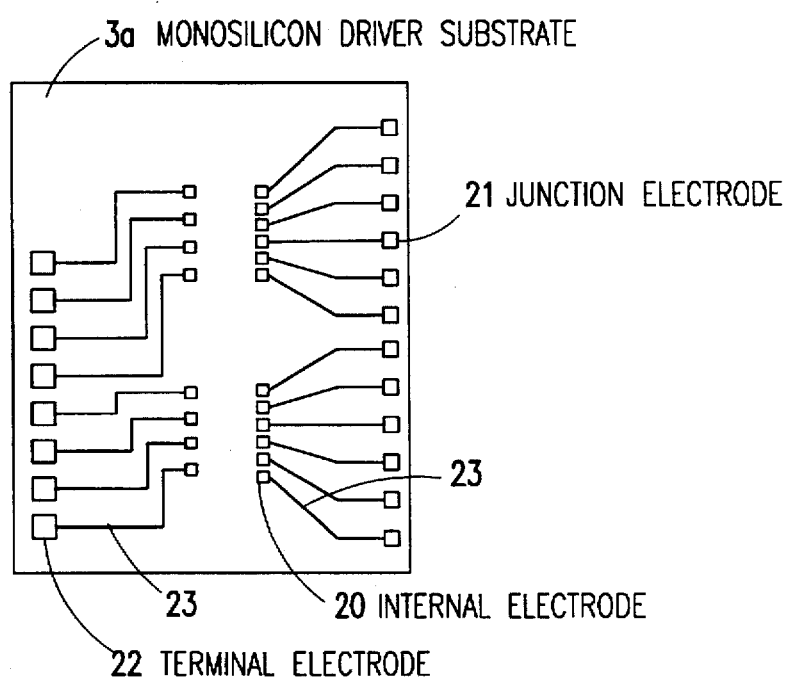
FIG. 10 is a top plan view of a monosilicon driver substrate equipped in the FIG. 1 embodiment.

FIG. 10 is a detailed plan view showing a single crystal silicon (monosilicon) driver substrate included in the FIG. 1 embodiment. In this embodiment, the monosilicon driver substrate 3a is composed of a single crystal silicon plate having opposite circuit faces. The substrate 3a is provided on each face with internal electrodes 20 which are formed for electrical contact to the semiconductor driving chips 2 (not shown). Namely, the semiconductor driving chip 2 is mounted on the substrate in facedown manner such that electrodes of the driving chip 2 are opposed to the electrodes 20 of the substrate 3a. The semiconductor driving chip 2 has a function to drive the semiconductor image sensor chips 1, and to process signals fed from the sensor chips 1 to thereby transmit information from the sensor chips to a system (not shown) outside the semiconductor image sensor device. In order to effect transmission of the signal to the external system, the monosilicon driver substrate 3a is formed with terminal electrodes 22 for external connection. Further, the monosilicon driver substrate 3a is provided with junction electrodes 21 at an end portion of top and bottom faces, close to an adjacent semiconductor image sensor chip 1 for electrical connection thereto. Moreover, the monosilicon driver substrate 3a is composed of the same material, i.e., single crystal silicon as those of the semiconductor image sensor chip 1, coupling chip 4 and semiconductor driving chip 2. Therefore, all the components have an identical thermal expansion coefficient, thereby eliminating degradation of mechanical alignment accuracy, which would be hindered due to difference in thermal expansion coefficients of components when the temperature is raised in the assembling process.

Figure 17:
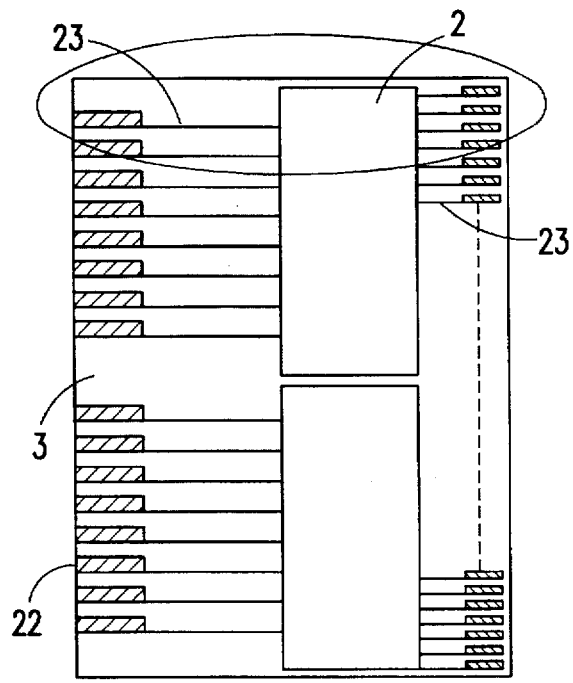
FIG. 17 is a detailed plan view showing the driver substrate where the semiconductor driving chip is mounted.
Figure 18:
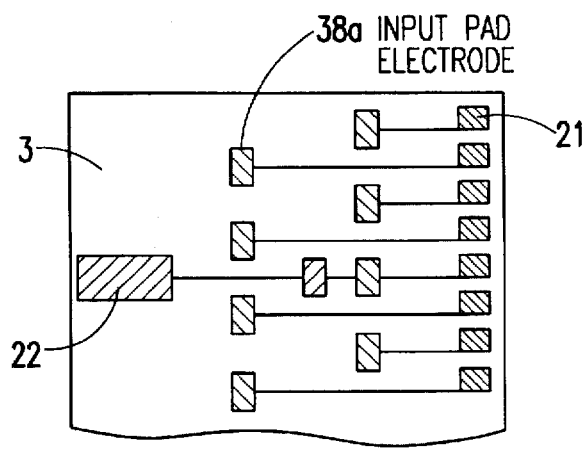
FIG. 18 is an enlarged partial plan view showing the driver substrate before mounting the semiconductor driving chip in the FIG. 17 embodiment.
Figure 19:
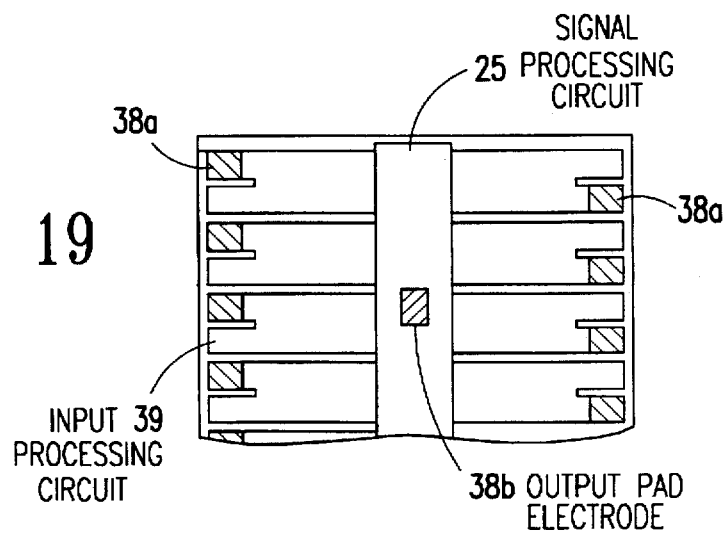
FIG. 19 is an enlarged partial plan view showing an active face of the semiconductor driving chip used in the FIG. 17 embodiment.

FIGS. 17, 18 and 19 show a detailed pattern arrangement of the driver substrate 3 used in the FIG. 1 embodiment of the invention. FIG. 17 is a detailed plan view showing semiconductor driving chips 2 mounted by facedown bonding on the driver substrate 3 of the FIG. 1 embodiment for driving the semiconductor image sensor device. FIG. 18 is a partial enlarged plan view showing an encircled portion (FIG. 17) of the driver substrate 3 in vertically expanded manner, before mounting the semiconductor driving chip 2. FIG. 19 is an enlarged partial plan view showing an active face, i.e., bottom face of the semiconductor driving chip 2. Though the pitch of junction electrodes 21 (line electrodes) is enlarged for illustrative purpose in FIGS. 17 and 18, actually the pitch is set narrow in the order of 50 μm.

In this embodiment, the driver substrate 3 is a silicon substrate having opposed major faces, which are formed with pad electrodes composed of gold bumps for electrical connection to opposed pad electrodes 38a of the semiconductor driving chip 2 in facedown manner. Each pair of the driving chips 2 are mounted on top and bottom faces of the driver substrate. The junction electrodes 21 are arranged closely at a pitch of 50 μm corresponding to that of sensing lines or strip lines of the sensor chip. The junction electrodes 21 are connected to the strip lines formed on the semiconductor image sensor chip 1 in a one-to-one manner through a coupling chip 4, as will be described later. For this, the pitch of junction electrodes 21 is set equal to that of the strip or sensing lines.

As shown in FIG. 19, the semiconductor driving chip 2 is formed with input pad electrodes 38a for receiving signals from the semiconductor image sensor chip 1 and an output pad electrode 38b for outputting a signal processed in the driving chip 2. Conventionally, the driving chip 2 and the driver substrate 3 are electrically connected by wire bonding. In such a case, bonding must be carried out around periphery of the driving chip 2. Further, for uniform electric performance, for suppressing resistance difference among lead patterns on a driver substrate, pad electrodes must be aligned in line along the junction electrodes 21. Therefore, the pad electrode pitch is equal to or less than the line electrode pitch. Consequently, wire bonding must be carried out at most at 50 μm intervals. On the other hand, in this embodiment, the input pad electrodes 38a are arranged in staggered manner with respect to the junction electrodes 21, and the output pad electrode 38b is formed centrally of the semiconductor driving chip 2. The input pad electrodes 38a are disposed in staggered manner along opposed ends of the chip, hence the electrode pitch is made twice as wide as the prior art using the wire bonding, thereby facilitating the mount work. In addition, the lead patterns are arranged on the driver substrate 3 under the driving chip 2 in regular manner, thereby avoiding degradation of electric performance. As shown in FIG. 18, the driver substrate 3 is formed with pad electrodes corresponding to the input and output pad electrodes 38a, 38b of the driving chip 3. As shown in FIG. 19, input processing circuits 39 are disposed adjacently to each input pad electrode 38a to function as an input buffer. A signal processing circuit 25 composed of a multiplexer and A/D converter etc. is disposed centrally to connect to the respective input processing circuits 39. The circuit 25 has terminals in the form of control output pad electrodes 38b for receiving power and a control signal such as a clock etc. and for transmitting a converted digital data output. In this embodiment, the semiconductor driving chip 2 operates to drive the semiconductor image sensor chips 1 and to process signals fed from the sensor chips for transmitting information from the image sensor chips 1 to an external system. The driver substrate 3 is provided with the junction electrodes 21 on top and bottom faces thereof adjacent to a next sensor chip for the electrical connection. In said embodiments of this invention, each substrate 3 has two semiconductor chips 2, but it is not restricted to this case, and four or five chips may be used to cover the whole range solely. This is determined by the IC production ability and the mounting cost.

Figure 11:
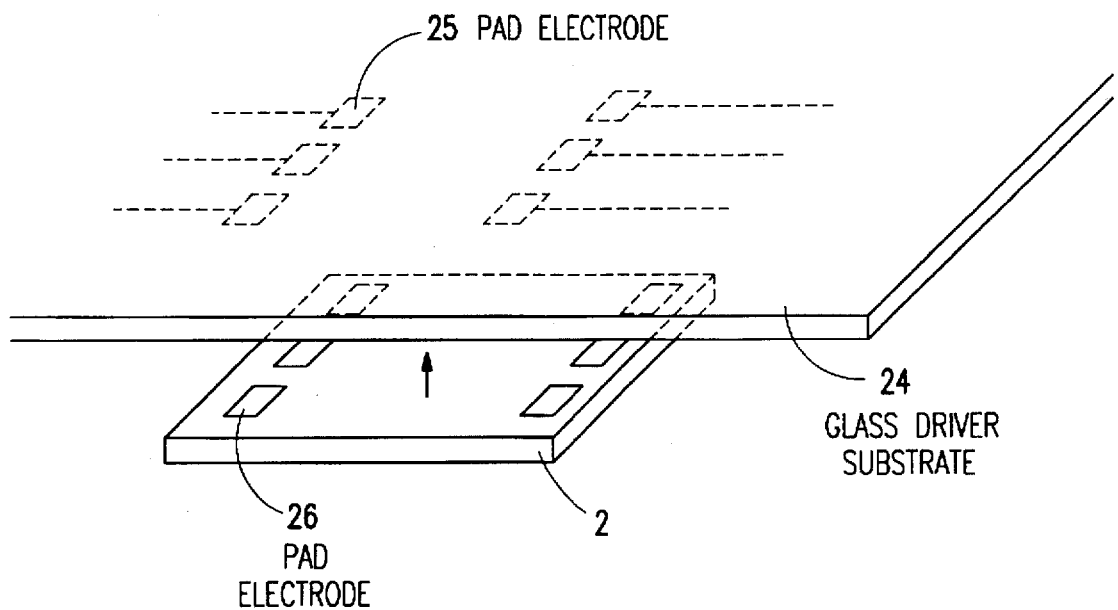
FIG. 11 is a perspective view showing aligning work of the semiconductor driving chip to a glass driver substrate in one embodiment of the inventive semiconductor image sensor device.

Referring to FIG. 11, a glass driver substrate 24 may be used in place of the monosilicon driver substrate 3a in the FIG. 1 embodiment. The driver substrate 24 is comprised of a glass plate having opposed major faces, which are formed with lead patterns and pad electrodes by aluminum film process. In FIG. 11, lead patterns are illustrated only on the bottom face for better understanding, and other patterns are eliminated from the top face. In this embodiment, an active face of the semiconductor driving chip 2 is directly viewed through the glass driver substrate 24, so that pad electrodes 25 can be aligned to corresponding pad electrodes 26 of the driving chip 2 by direct observation to thereby facilitate mount working. The glass driver substrate 24 may be composed of a pyrex glass having a thermal expansion coefficient comparable to that of the monosilicon in the range of room temperature to 500° C., thereby avoiding degradation of mechanical alignment accuracy due to thermal expansion rate difference.

Figure 2:
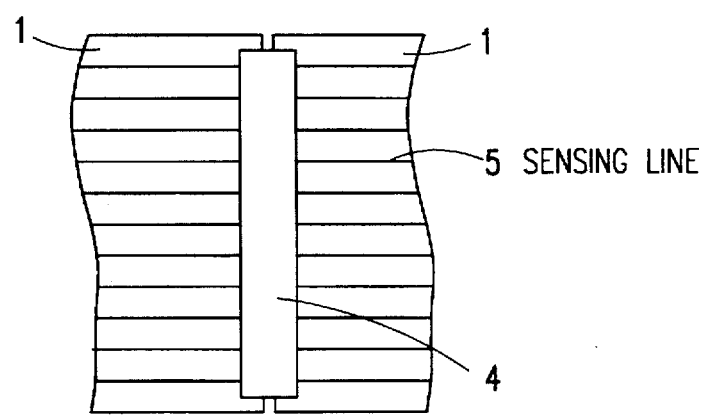
FIG. 2 is an enlarged top plan view showing a junction portion of the FIG. 1 embodiment.
Figure 3:
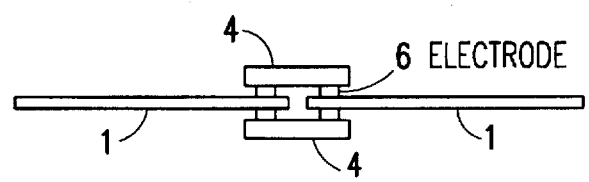
FIG. 3 is an enlarged side view showing the junction portion of the FIG. 1 embodiment.
Figure 4:
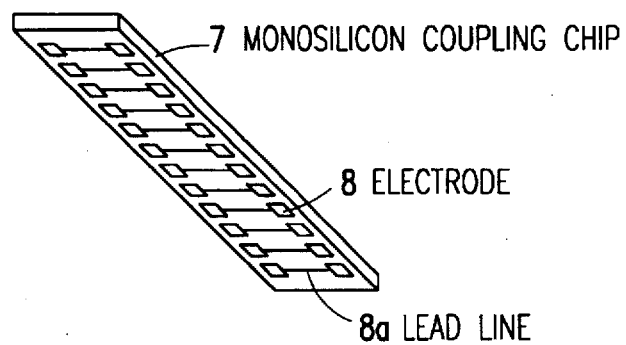
FIG. 4 is a perspective bottom view showing a coupling chip adopted in the FIG. 1 embodiment.

Next, the description is given for mechanical and electrical coupling between adjacent sensor chips 1 and between an end sensor chip 1 and the driver substrate 3. FIG. 2 is an enlarged top view showing the coupling portion between a pair of adjacent semiconductor image sensor chips 1 contained in the FIG. 1 embodiment. FIG. 3 is an enlarged side view corresponding to the enlarged top view of FIG. 2. Further, FIG. 4 is a perspective bottom view showing the coupling chip 4 composed of a monosilicon chip 7 appearing in FIGS. 2 and 3. In the construction shown in FIGS. 2 and 3, the semiconductor image sensor chip 1 and the coupling chip 4 are electrically connected to each other such that the junction electrodes of both chips are superposed to each other. As shown in FIG. 2, the semiconductor image sensor chip 1 is formed on its top and bottom faces with sensing lines 5 at a constant pitch. Electrodes 6 (FIG. 3) are provided at ends of the respective sensing lines 5 in the form of gold bumps for external electrical connection (not shown in FIG. 2). In turn, as shown in FIG. 4, the coupling chip in the form of the monosilicon chip 7 is provided with lead lines 8a and corresponding junction electrodes 8 on one face opposed to the semiconductor sensor chip 1 at the same pitch as that of the sensing lines 5. Each junction electrode 8 is composed of a gold bump for electrical contact with the corresponding junction electrode 6 formed on the semiconductor image sensor chip 1. The electrical connection is made therebetween such that the opposed bumps are fused to each other by gold/gold eutectic bond. Alternatively, the electrical coupling may be provided by using an electroconductive adhesive of anisotropic type containing electroconductive particles in adhesive material.

In such a construction, the electrical coupling and mechanical coupling are concurrently carried out in the semiconductor image sensor device. With regard to the electrical connection, in contrast to the conventional wire bonding method, all the junction electrodes are coupled at once, thereby significantly reducing steps of the assembling process. Further, after the coupling treatment, the junction electrodes and lead lines involved in the coupling portion are concealed and protected under the coupling chip 4, thereby improving reliability and quality of the electrical connection.

Figure 5:
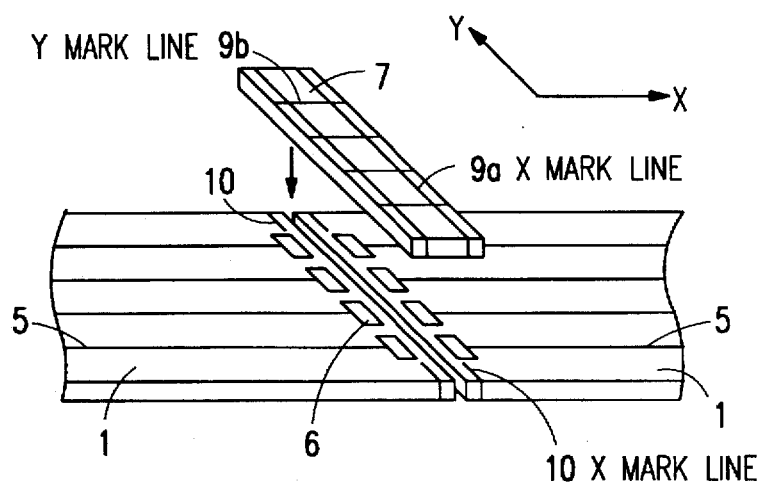
FIG. 5 is a perspective view illustrating aligning operation of a monosilicon coupling chip in an embodiment of the inventive semiconductor image sensor device.

FIG. 5 illustrates how the monosilicon coupling chip 7 is accurately aligned to the junction electrodes 6 of the image sensor chip 1. Namely, when the monosilicon coupling chip 7 is superposed on the sensor chips 1, both of the junction electrodes are concealed and hidden from view. In view of this, an X mark line 9a and a Y mark line 9b are provided on a top face of the monosilicon coupling chip 7. With respect to the X axis, the X mark line 9a is aligned to a corresponding X mark line 10 formed on the sensor chip 1. With regard to the Y axis, similarly the Y mark line 9b is aligned to a corresponding sensing line 5 formed on the image sensor chip 1, thereby registering the opposed and concealed junction electrodes with each other. After the alignment, mechanical and electrical coupling is effected by gold/gold eutectic bonding between opposed gold bumps, or by anisotropic electroconductive adhesive to thereby mechanically and electrically unite the adjacent semiconductor image sensor chips 1 with each other.

Figure 7:
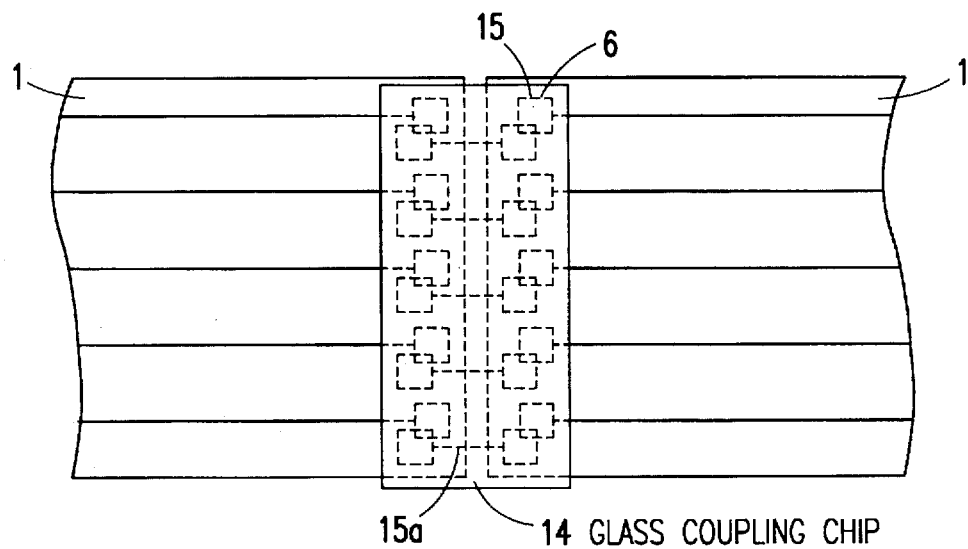
FIG. 7 is a top plan view illustrating aligning work of a glass coupling chip in one embodiment of the semiconductor image sensor device.
Figure 8:
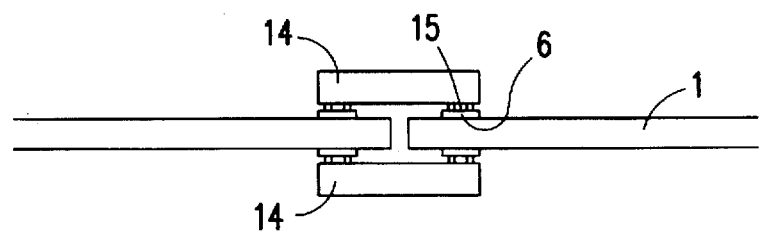
FIG. 8 is an enlarged side view showing a coupling part using the glass coupling chip in the same embodiment.
Figure 9:
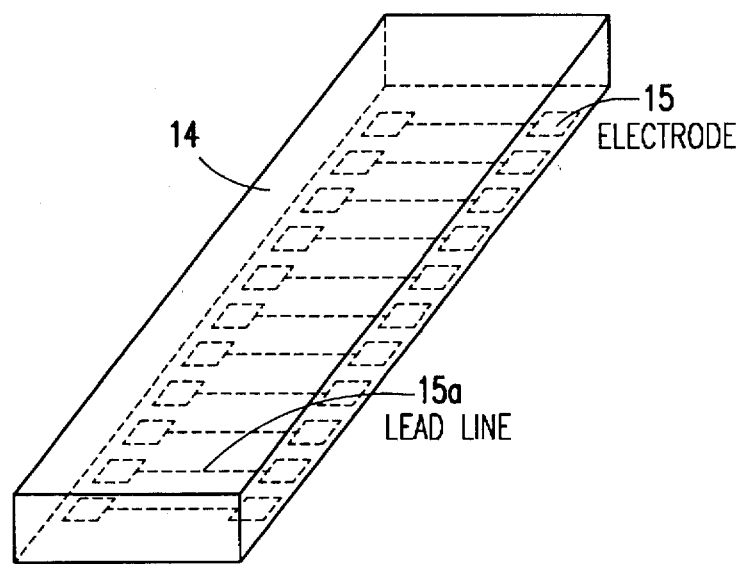
FIG. 9 is a perspective view showing the glass coupling chip.

FIG. 7 shows a glass coupling chip 14 which may be used as the coupling chip 4 connecting between the adjacent sensor chips 1 in the FIG. 1 embodiment. This figure shows a superposed state before the alignment. FIG. 8 shows an aligned state of the same. Further, FIG. 9 shows a perspective view of the glass coupling chip 14. In the FIG. 8 state, the pair of semiconductor image sensor chips 1 are electrically coupled to each other by the intermediate glass coupling chip 14 while opposed junction electrodes are registered with each other. As shown in FIG. 7, before the alignment, the electrodes 6 of the sensor chip 1 are dislocated from the corresponding electrodes 15 of the glass coupling chip 14. Sensing lines 5 are formed on top and bottom faces of the sensor chip 1 at a given constant pitch. The pad or junction electrode 6 is disposed at both ends of each sensing line 5 for external electric connection. Further, as shown in FIG. 9, the glass coupling chip 14 is formed with lead patterns 15a and electrodes 15 on one face opposed to the sensor chip 1 at the same pitch. In FIGS. 7 and 9, portions indicated by dashed line are viewed through a transparent glass of the coupling chip 14. During the alignment, the electrodes 15 and lead patterns 15a formed on the coupling chip 14 can be viewed through the transparent glass in superposed relation to corresponding electrodes and lead patterns of either of the sensor chip 1 and driver substrate 3, thereby facilitating alignment work. These components may be assembled together by, for example, an anodic bonding method. This method is effected such that the glass coupling chip 14 is disposed on either of monosilicon sensor chip 1 or driver substrate 3, while a high voltage about several hundred volts level is applied between the glass and monosilicon components under heating at about 400° C. Consequently, the glass plate is mechanically bonded to the silicon plate. Such a method will be described later in detail.

When the silicon and glass plates are coupled to each other by the anodic bonding, the electrodes 15 on the glass coupling chip 14 are pressed to the corresponding electrodes 6 of the sensor chip 1 to ensure the electrical connection. FIG. 8 shows such an electrical connection where quite thin films of the opposed electrodes 6, 15 are superposed with each other. Accordingly, the anodic bonding can carry out concurrently both the electrical and mechanical couplings. With respect to the electrical connection, all of the electrodes can be processed at once to thereby reduce fabrication steps as opposed to the wire bonding method. Further, the electrodes and lead patterns are concealed under the coupling chip 14 to thereby protect the coupling portion to improve reliability of the connection, in a manner similar to the previous embodiment.

Figure 20:
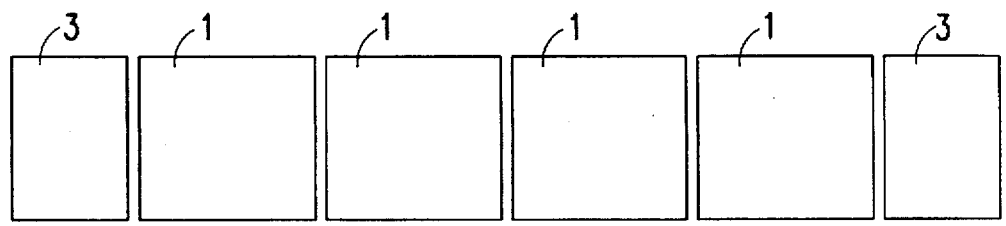
FIG. 20 is a top plan view showing relative positional relation among semiconductor image sensor chips and driver substrates equipped in the FIG. 1 embodiment.

Next, the description is given for a production method of the FIG. 1 embodiment. FIG. 20 is a top plan view showing a relative alignment relation of the semiconductor image sensor chips 1 and the driver substrates 3 in the embodiment of the inventive semiconductor image sensor device. Namely, this figure shows a first step of the production method of the inventive device. Four semiconductor image sensor chips 1 are aligned in the lengthwise direction of the device such that respective coupling portions are disposed adjacently to each other. The pair of driver substrates 3 are aligned at opposite ends of the serially aligned chips 1 such that the coupling portion of each driver substrate 3 is disposed to face the adjacent semiconductor image sensor chip 1. These chips 1 and substrates 3 are aligned relatively to one another such that a coupling chip 4 (not shown) can register with the junction electrodes formed on the sensor chips 1 and driver substrates 3. The alignment treatment is carried out such that an aligning arm is operated to displace the chips and substrates while monitoring the position of lead and electrode patterns from top view. Alternatively, a chip mounting tool may be utilized for the alignment treatment.

Figure 21:
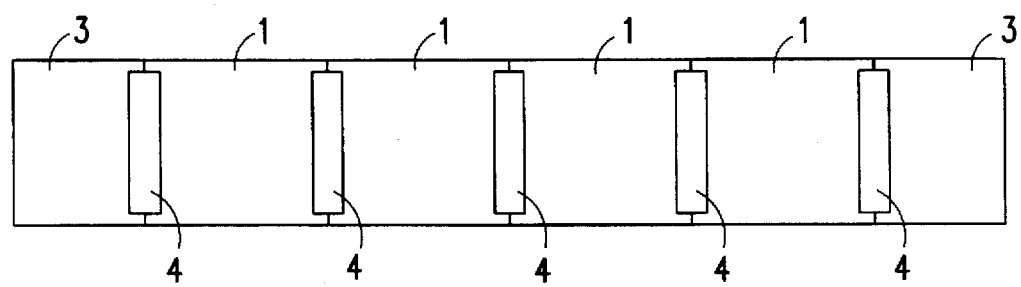
FIG. 21 is a top plan view showing a coupled state in which the semiconductor image sensor chips and driver substrates are connected by the coupling chips in the FIG. 1 embodiment.

FIG. 21 is a top plan view showing a second step of producing the inventive semiconductor image sensor device, in which the semiconductor image sensor chips 1 and the driver substrates 3 are connected to each other by means of the coupling chips 4. The coupling chip 4 can be selected from either of the monosilicon coupling chip 7 and the glass coupling chip 14. The coupling chip 4 is formed on one face thereof with lead lines 8a and junction electrodes 8 shown in FIG. 4. The coupling chip 4 is placed in facedown manner such that the junction electrodes 8 are aligned in contact with corresponding junction electrodes formed on either of the sensor chip 1 and driver substrate 3 so as to effect facedown bonding. By this step, the four semiconductor image sensor chips 1 and the two the driver substrates 3 are mechanically united with each other, though semiconductor driving chips 2 are not yet mounted and bottom or rear coupling is not yet carried out on the bottom face of the device. Consequently, even if external force is applied thereafter, the semiconductor image sensor chips 1 and the driver substrates 3 can be prevented from dislocation. Then, a third step is carried out such that semiconductor driving chips 2 are mounted on top faces of the driver substrates 3 disposed at opposite ends of the device. Thereafter, other coupling chips 4 are utilized to carry out the bottom face coupling for the already aligned components. Lastly, other semiconductor driving chips 2 are mounted on the bottom or rear face of the driver substrates 3, thereby completing the semiconductor image sensor device as shown in FIG. 1.

Figure 22:
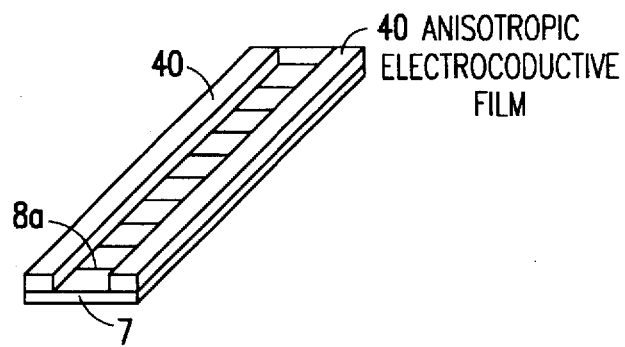
FIG. 22 is a perspective view of a coupling chip, where an anisotropic electroconductive film is temporarily adhered to junction electrodes of the coupling chip.

Next, the description is given for bonding method of the coupling chip by using an anisotropic electroconductive adhesive. FIG. 22 is a perspective view showing an anisotropic electroconductive film 40 which is a kind of anisotropic electroconductive adhesive. As shown in the figure, the film 40 is temporarily fixed by thermal pressing onto the junction electrodes of the monosilicon coupling chip 7 which may be alternatively adopted in the embodiment of the inventive semiconductor sensor device. Further, a glass coupling chip may be used in place of the monosilicon coupling chip. In the second step as described before, the anisotropic electroconductive film 40 is shaped in a desired form, and is provisionally and temporarily fixed to the junction electrodes 8 of the lead lines 8a formed on the coupling chip 7, by applying pressure and heat.

Figure 23:
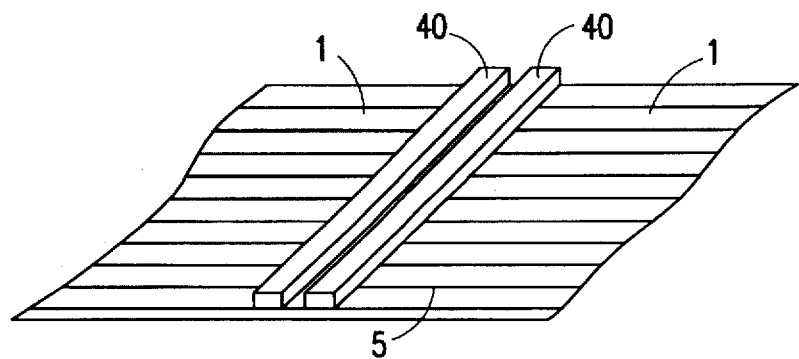
FIG. 23 is a perspective view in which an anisotropic electroconductive film is temporarily adhered to junction electrodes of adjacent semiconductor image sensor chips.

Referring to FIG. 23, in a manner similar to FIG. 22, other anisotropic electroconductive films 40 are temporarily pressed and fixed to a connecting portion of the semiconductor image sensor chip 1. In this manner, as preparing step of the coupling, the anisotropic electroconductive adhesive may be applied to one of or both of the coupling chip 7, and the semiconductor image sensor chip 1 or driver substrate 3.

At this point, detailed description is given for the anisotropic electroconductive film 40. The film 40 is of a two-face adhesive tape having a thickness in the order of 20–30 μm and having sticky opposite faces. This adhesive tape is sandwiched by a pair of parting lines, and is generally wound around a reel. The adhesive tape is composed of a matrix resin such as epoxy containing electroconductive particles having a diameter in the order of several μm to several tens of μm.

Figure 31:
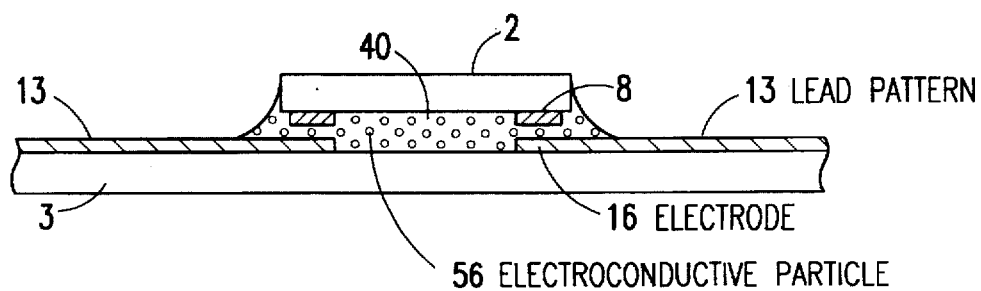
FIG. 31 is an enlarged sectional diagram showing a mount portion of the semiconductor driving chip on the driver substrate.

Referring to FIG. 31, for explanatory purpose, the semiconductor driving chip 2 is mounted on the driver substrate 3 by means of an anisotropic electroconductive film 40. The driving substrate 2 is disposed on the driver chip 3 through the anisotropic electroconductive film 40 such that electrodes of the chip 2 are aligned to corresponding lead patterns 13 of the substrate 3. Thereafter, heat and pressure are applied therebetween so that the anisotropic electroconductive film 40 is compressed such that electroconductive particles 56 are directly contacted to both of the electrodes 8 and the electrodes 16 to establish electrical conduction therebetween. However, the electroconductive particles 56 do not contact with each other in the horizontal direction to ensure insulation therebetween. Namely, the anisotropic electroconductive film 40 is electroconductive in the vertical direction and insulative feature in the horizontal direction. The anisotropic electroconductive film 40 can be of various types depending on the kind of organic adhesive material, the thickness of the film, the kind of electroconductive particles and the density of the particles. Two types of anisotropic electroconductive films were tested for bonding the coupling chip 4 and the image sensor chip 1 having gold bump electrodes which have a height of 10 μm and an area of 100 μm×40 μm. The test results are shown in the following table. Each sample contains 1280 junction electrodes.

TABLE

| Adhesive material | Film thickness | Composition of electro-conductive particle | Particle density | Pass rate |
|---|---|---|---|---|
| Epoxy | 25 μm | Plastic particle plated by gold, and having 5 μm of diameter | 8% | 98% |
| Epoxy | 25 μm | Plastic particle plated by gold, and further coated by insulative | 32% | over 99.9% |

TABLE-continued

| Adhesive material | Film thickness | Composition of electro-conductive particle | Particle density | Pass rate |
|---|---|---|---|---|
| | | film, and having 5 μm of diameter | | |

As shown in the table, the first anisotropic electroconductive film has a rather low particle density hence the test pass rate is not so high. On the other hand, the second film has an increased particle density so that the test pass rate reaches a practical level. In the second film composition, the electroconductive particles are coated by insulative film to avoid horizontal conduction, while increasing the density. This insulative coating is easily broken at the contact to the electrode or lead pattern when applied with heat and pressure to thereby provide electrical conduction in the vertical direction.

Referring to FIG. 24, in the embodiment of the inventive semiconductor image sensor device, a pair of the semiconductor image sensor chips 1 are coupled by one monosilicon coupling chip 7 having the anisotropic electroconductive films 40 which are thermally pressed. The pair of semiconductor image sensor chips 1 and the monosilicon coupling chip 7 are positioned relative to each other such that opposed junction electrodes are registered with each other. The anisotropic electroconductive films 40 are interposed between the opposed junction electrodes. In such an arrangement, a heated thermal pressing head 45 is lowered to a connecting portion to apply thereto pressure so as to achieve both electrical conduction and mechanical connection between the pair of semiconductor image sensor chips 1. This treatment may be also applied to connection between a semiconductor image sensor chip 1 and a driver substrate 3, and to coupling on the rear face of the device. The use of the anisotropic electroconductive adhesive can significantly lower the processing temperature as composed to the gold/gold eutectic bonding. The anisotropic electroconductive adhesive requires the processing temperature of less than 200° C., while the gold/gold eutectic bonding requires the processing temperature of 400°–500° C. Accordingly, such a coupling process can improve workability and safety of the device production, and can prevent degradation of quality of the respective components in the semiconductor image sensor device. Alternatively, a glass coupling chip may be used in place of the monosilicon coupling chip for electrically and mechanically bonding the semiconductor image sensor chip 1 by the anodic bonding method, as described before.

Figure 6:
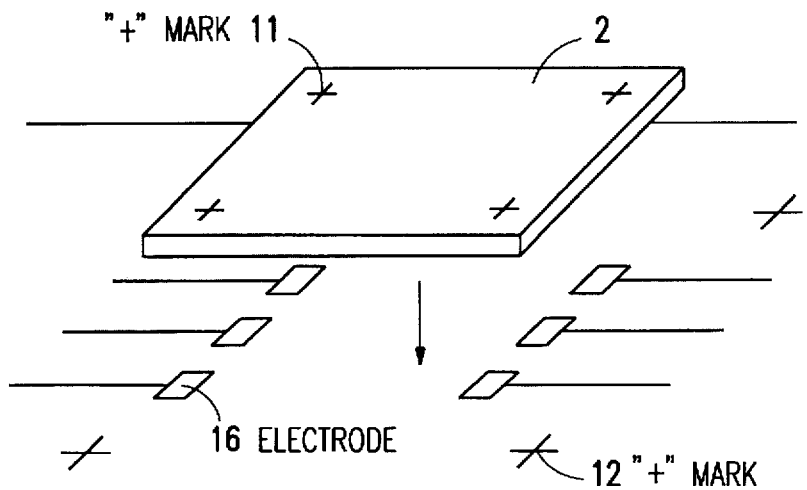
FIG. 6 is a perspective view illustrating another aligning operation of a driving chip.

FIG. 6 shows one method of mounting a semiconductor driving chip 2 on the driver substrate 3. The driving chip 2 is formed on its top face 2a with four visually recognized "+" marks 11. These "+" marks 11 can be patterned in alignment with patterns and electrodes formed on the active bottom face thereof with a quite high accuracy of less than several μm by using a two-face aligner. The mark can be selected from a rectangle, a triangle and others instead of the "+" mark for the alignment. On the other hand, four corresponding "+" marks 12 are formed on the driver substrate 3 for determining the right position of the driving chip 2 with reference to the "+" marks 11. Initially, the driving chip 2 is placed near the right position on the driver substrate 3 while the active face of the driving chip 2 is opposed to the driver substrate 3. Then, visual recognition is undertaken for both of the "+" marks 11, 12 so as to adjust the position of the driving chip. Consequently, the electrodes 16 of the substrate 3 are matched to corresponding electrodes formed on the active face of the driving chip 2. In this operation, the visual recognition is undertaken by directly viewing both of the chip and substrate marks 11, 12 through a video camera to enable accurate mounting of the driving chip having very high integration density. After the mounting, the relative position between the chip and substrate marks 11, 12 are measured to check the mounting accuracy.

Figure 12:
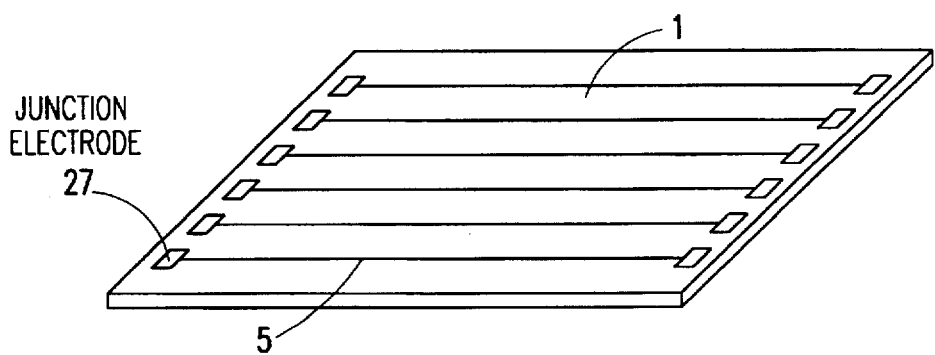
FIG. 12 is a perspective view showing a semiconductor image sensor chip mounted in the FIG. 1 embodiment of the inventive semiconductor image sensor device.

FIG. 12 shows one example of semiconductor image sensor chip 1. The sensor chip 1 is formed with sensing lines 5 and junction electrodes 27. When the sensor chip 1 is bonded by the coupling chip 4 as shown in FIGS. 1, 2 and 3 by the facedown bonding, the junction electrodes 27 and the lead lines are concealed under the coupling chip 4. Accordingly, some difficulties may be caused such as: first, it would be difficult to undertake electrical conduction check for individual connecting points after the bonding; second, it would be difficult to repair a contact defect.

Figure 13:
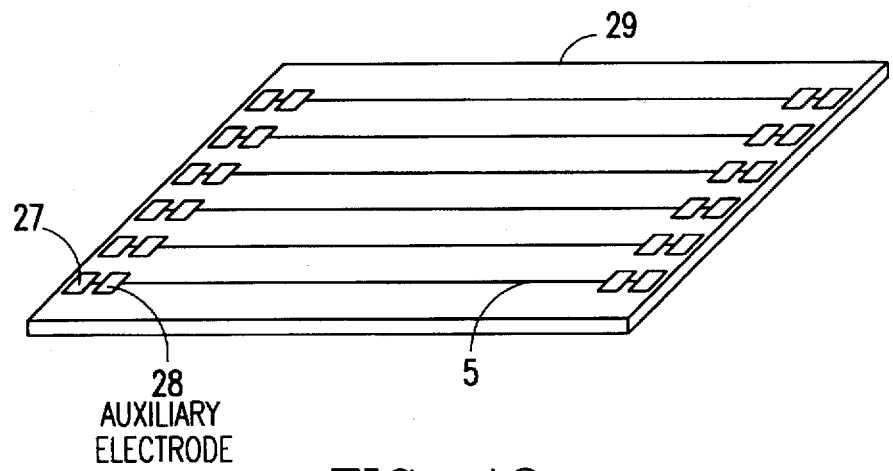
FIG. 13 is a perspective view of a semiconductor image sensor chip having an auxiliary electrode.
Figure 14:
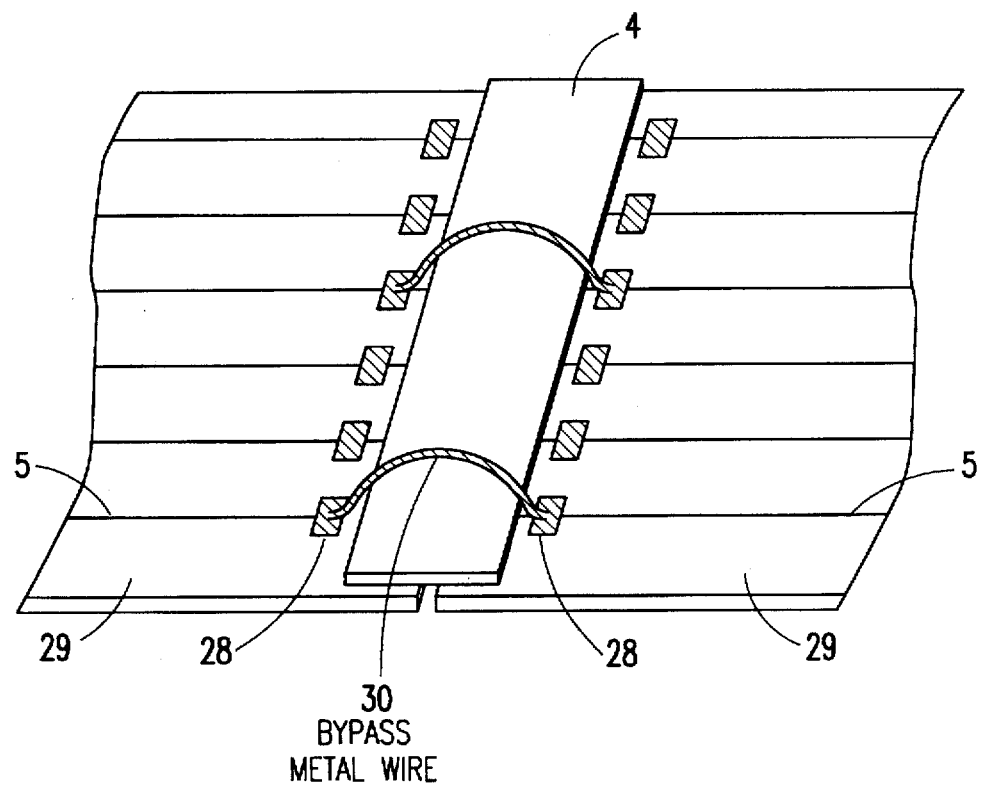
FIG. 14 is a perspective view showing a state where a contact defect is repaired.
Figure 15:
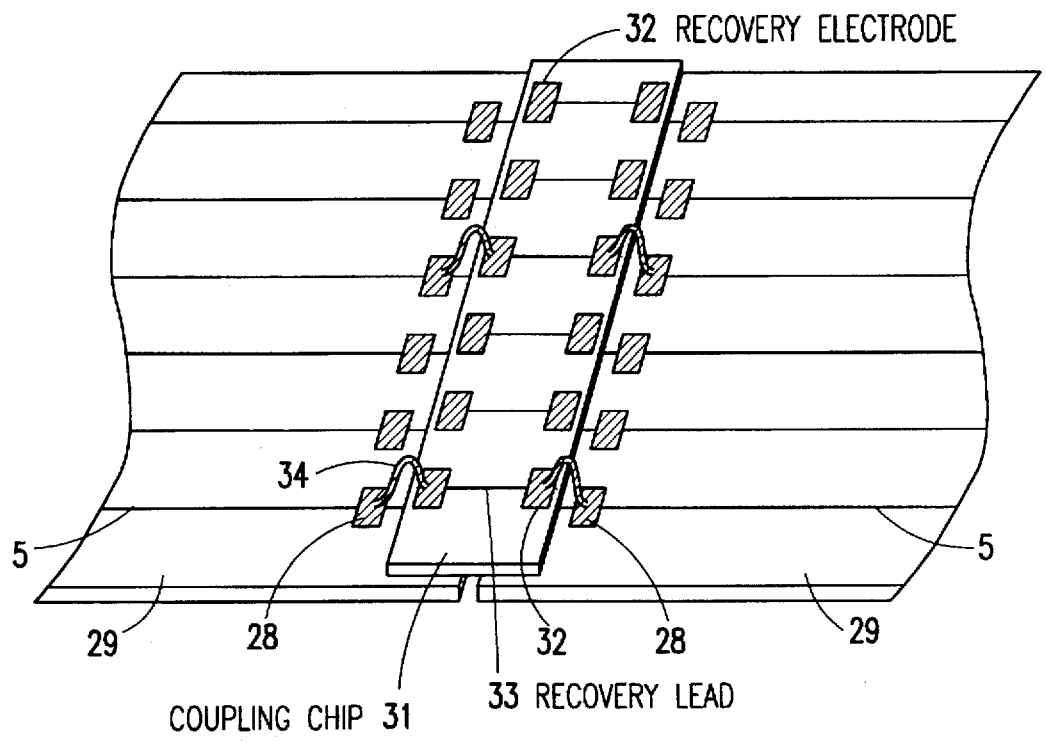
FIG. 15 is a perspective view showing another state where a contact defect is repaired.
Figure 16:
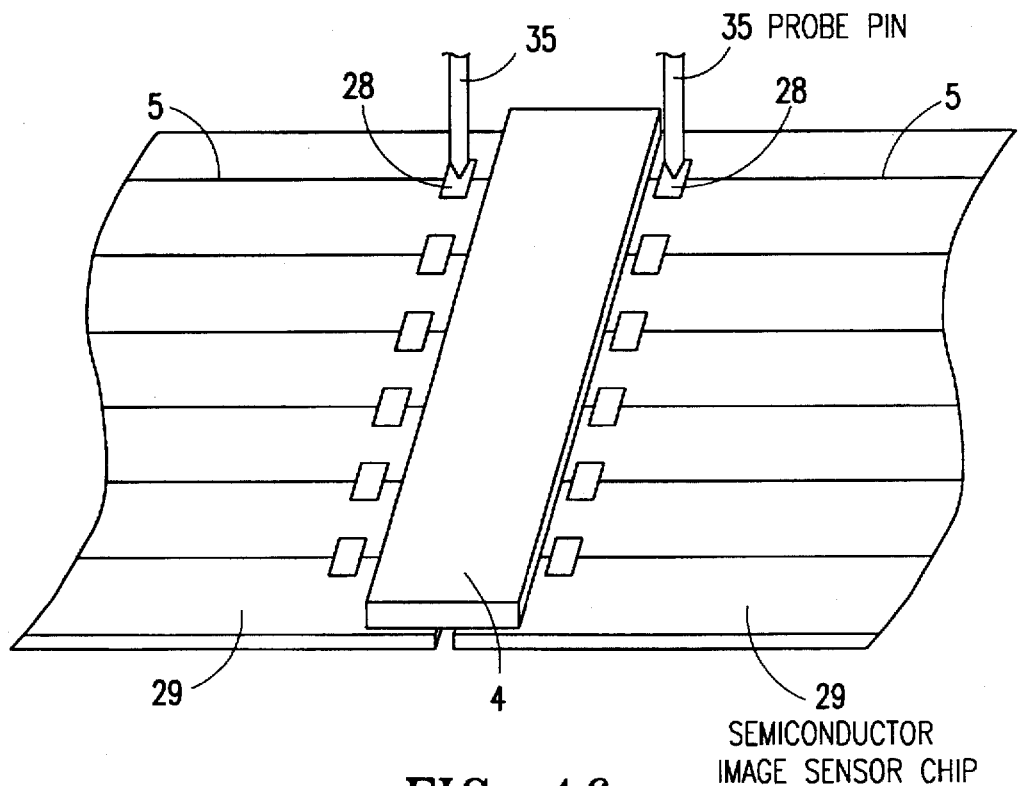
FIG. 16 is a perspective view showing checking work of contacts in one embodiment of the inventive semiconductor image sensor device.

In view of the above noted drawbacks, FIG. 13 shows another example of semiconductor image sensor chip 29 having auxiliary electrodes. The auxiliary electrodes 28 are formed adjacent to the corresponding junction electrodes 27 at the end of the respective sensing lines 5, and are located in exposed areas not covered by coupling chips. As shown in FIGS. 14, 15 and 16, the auxiliary electrodes 28 are utilized for electrical conduction check and repair of contact defects.

FIG. 14 shows one method of repairing a contact defect which would be caused when a pair of sensor chips 29 are coupled by a coupling chip 4. In this embodiment, the conduction check is carried out so that initial contact defects are found at the first line and the fourth line. Then, a bypass metal wire 30 is connected between the corresponding auxiliary electrodes 28 involved in the contact defect across the coupling chip 4 by means of wire bonding, thereby correcting the contact or conduction defect. By such repair, the initially defective image sensor device can be saved as a good device which can operate normally. The bypass line 30 can be connected by soldering or conductive adhesive other than the wire bonding. The effective repairing can raise yield rate to realize reduction in production period and production cost, and can realize maintenance in the field.

FIG. 15 shows another repairing structure for contact defects using the sensor chips 29 having the auxiliary electrodes. This embodiment is different from the FIG. 14 embodiment in that the coupling chip 31 is formed on its top face with recovery leads 33 and recovery electrodes 32 in corresponding to the sensing lines 5. For example, the device has initial contact defects at the first and fourth lines. Then, the auxiliary electrode 28 involved in the contact defect is connected to the adjacent recovery electrode 32 at opposite sides of the coupling chip 31 to repair the defect part. By this, a signal path along the sensing line is established in the defect part from the right sensor chip to the left sensor chip through a sensing line 5—an auxiliary electrode 28—a bypass wire 34—a recovery electrode 32—a recovery lead 33—another recovery electrode 32—another bypass wire 34—another auxiliary electrode 28—another sensing line 5. On the other hand, a regular signal path is established through a sensing line 5—a junction electrode 27 of the sensor chip (concealed)—corresponding junction electrode of the coupling chip (concealed) another junction electrode of the coupling chip (concealed)—another corresponding junction electrode of the other sensor chip (concealed)—another sensing line 5. The recovery electrode and recovery lead may have various shapes, compositions and locations. For example, a large central recovery electrode may be formed on the top face of the coupling chip for providing an intermediate spot while eliminating the recovery leads. The use of recovery electrodes can reduce the length of the bypass wire as compared to the direct bypass between the pair of separate auxiliary electrodes, thereby facilitating repair work by using a regular wire bonding machine, and improving reliability.

FIG. 16 shows a method of conduction checking using the auxiliary electrodes 28 after the pair of semiconductor image sensor chips 29 are connected to each other by the coupling chip 4. In this embodiment, a pair of probe pins 35 are contacted to a corresponding pair of the auxiliary electrodes 28 along one sensing line 5 across the coupling chip 4 to measure the junction resistance to effect conduction check. All of the sensing lines 5 are sequentially subjected to the conduction check by using the probe pins 35 to thereby identify a defect. Thereafter, the defect part is repaired as shown in FIGS. 14 and 15. Further, the auxiliary electrodes 28 may be utilized for measurement of the electrical characteristics of the junction part and for maintenance. Any check method can be adopted to detect the conduction between pairs of separate auxiliary electrodes 28. The repairing and checking using the auxiliary electrodes 28 shown in FIGS. 13, 14 and 15 can be applied to the coupling between the sensor chip 1 and the driver substrate 3 by preparing similar auxiliary electrodes on the driver substrate 3.

Figure 27:
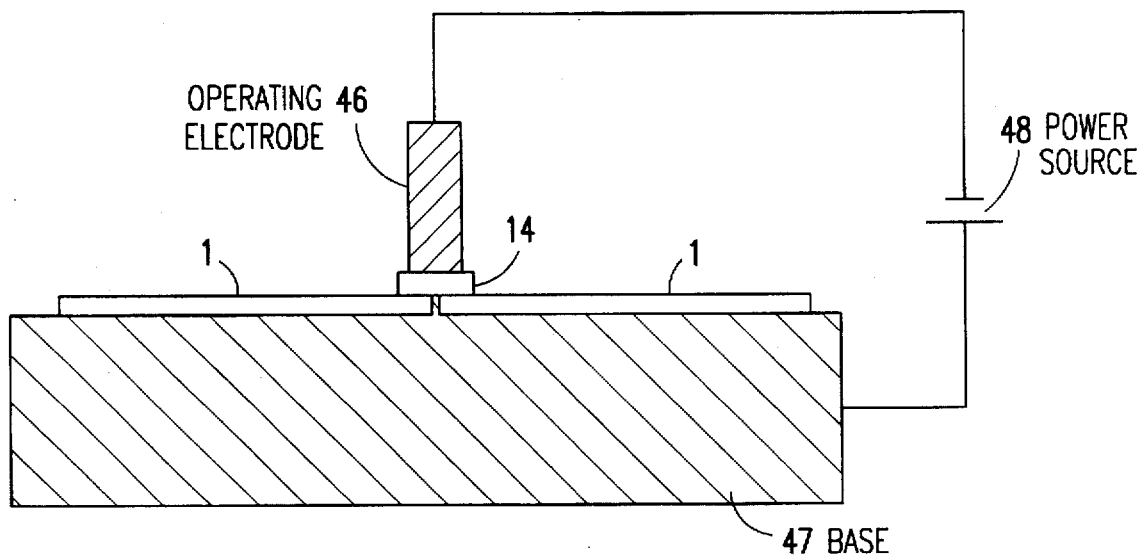
FIG. 27 is an illustrative diagram showing the principle of anodic bonding method for bonding the glass coupling chip to the semiconductor image sensor chip.

Next, the description is given for the anodic bonding used in the invention. Referring the FIG. 27, the glass coupling chip 14 is chemically bonded to the semiconductor image sensor chip 1 by anodic bonding. Firstly, a power source 48 is connected between a base 47 composed of conductive material such as metal and an operating electrode 46 such that a negative voltage is applied to the operating electrode 46 and a positive voltage is applied to the base 47. Further, the base 47 is heated at about 400° C., and a pair of semiconductor image sensor chips 1 composed of Si wafer are disposed on the base 47. Further, a glass coupling chip 14 composed of pyrex glass is disposed on the pair of sensor chips 1. Then, the operating electrode 46 is contacted to the glass coupling chip 14 to apply a voltage of about 400 V across the glass coupling chip 14 and the pair of semiconductor image sensor chips 1 under heating at 400° C. Therefore, a contact between the silicon and the glass is subjected to an electric field. Under such a condition, sodium ions ($Na^+$) are drawn upward to the operating electrode 46 so that only silicon atoms are left around the contact portion, whereby both of the silicon layers are adhered to each other to effect mechanical unification. This is the basic principle of anodic bonding. Surfaces of both parts must be made smooth and clean for stable bonding.

Figure 28:
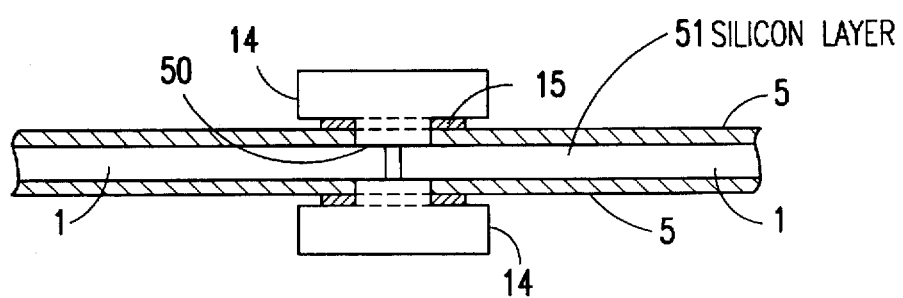
FIG. 28 is a sectional diagram where the semiconductor image sensor chips are coupled by using the glass coupling chip shown in FIGS. 25, 26.

FIGS. 25 and 26 show an example of a glass coupling chip 14 for bonding the semiconductor image sensor chips 1 by anodic bonding. FIG. 25 is a plan view, and FIG. 26 is a sectional view taken along the line A-A' of FIG. 25. A protruding portions 50 hatched as shown in FIG. 25 made 2–3 μm higher than the remaining portion containing lead lines 15a, as indicated in FIG. 26. The remaining portion has the same level, formed with the lead lines 15a and electrodes 15. FIG. 28 is an enlarged partial section taken along the lengthwise direction, showing an electrical and mechanical coupled state between the glass coupling chip 14 of the FIGS. 25 and 26 structure, and the pair of semiconductor image sensor chips 1. The glass coupling chip 14 is contacted at its protruded portion 50 to a silicon layer 51 of the sensor chips 1 such that both of the layers are chemically united by the anodic bonding. By the bonding force between both the parts, the sensing lines composed of aluminum on the sensor chips 1 are mechanically pressed to electrodes 15 of the glass coupling chip 14 to thereby provide electrical connection.

Figure 29:
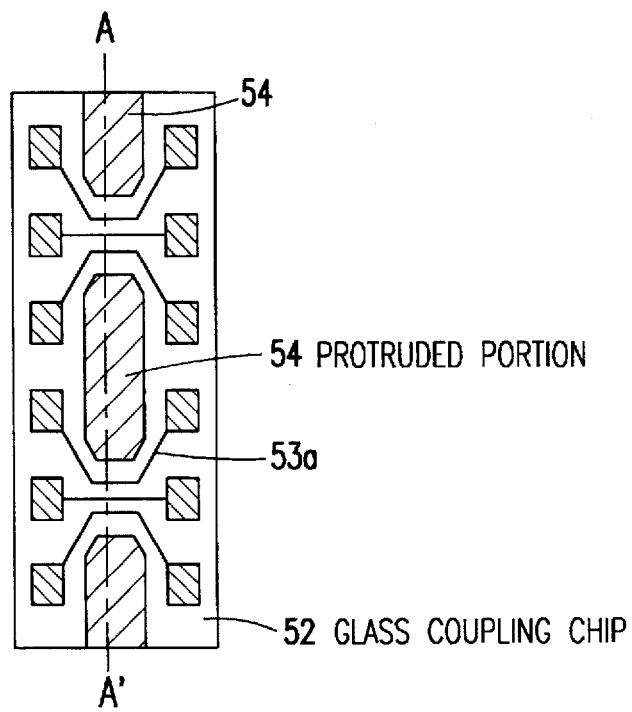
FIG. 29 is a detailed plan view showing one variation of the FIG. 25 glass coupling chip.
Figure 30:
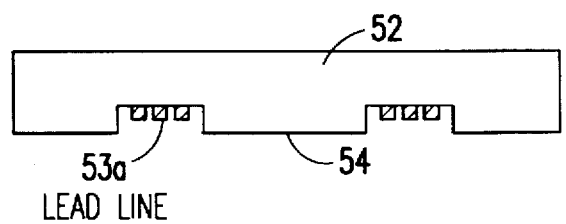
FIG. 30 is a sectional diagram of the FIG. 29 glass coupling chip, taken along the line A-A'.

FIG. 29 shows another example of a glass coupling chip 54 which is different from the FIG. 25 glass coupling chip 14. FIG. 30 is a sectional view thereof taken along the line A-A'. In contrast to the prior example of FIGS. 25 and 26, a set of three lead lines 53a is passed between adjacent protruded portions 54 in order to permit the area of protruding portion 54 to be increased. By such an arrangement, there can be obtained a larger bonding area to improve stability and strength of the bonding, as compared to the FIGS. 25 and 26 example.

In methods according to the invention, the coupling chips may be joined to the semiconductor chips and the driver substrate by blowing an electroconductive material to form electrical connections.

Figure 32:
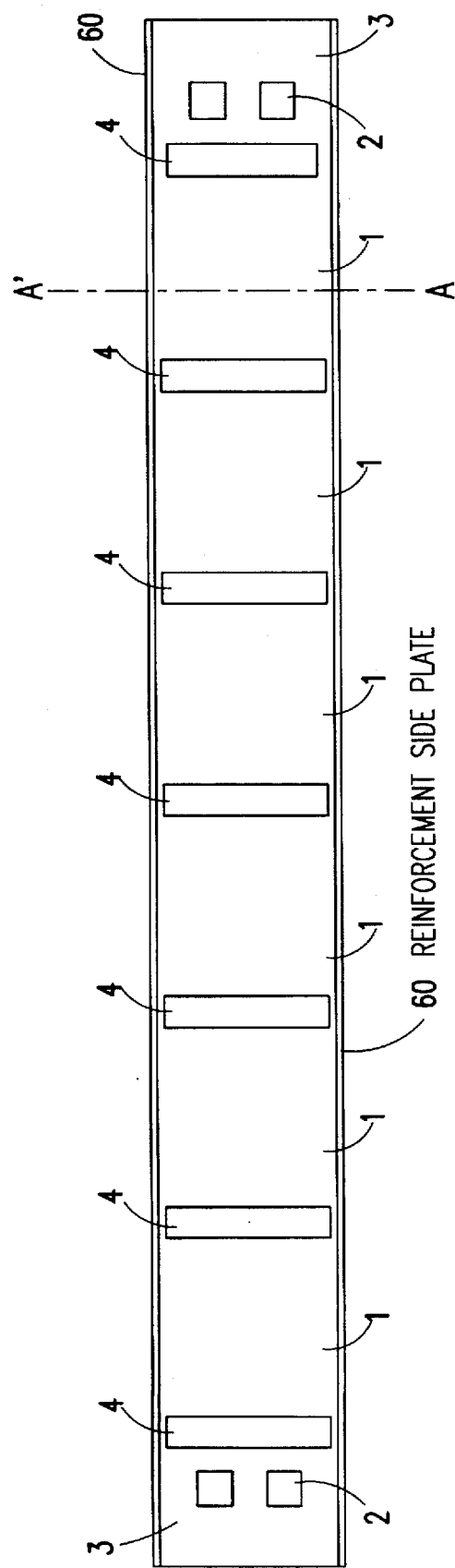
FIG. 32 is a top plan view showing another embodiment of the inventive semiconductor image sensor device.
Figure 33:
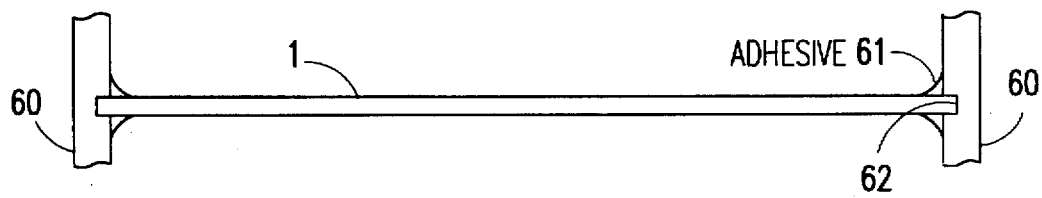
FIG. 33 is a sectional view taken along the line A-A' of FIG. 32.
Figure 34:
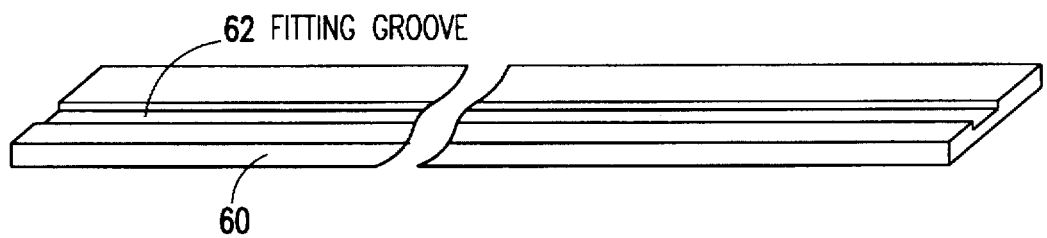
FIG. 34 is a enlarged perspective view showing a reinforcement side plate provided in the FIG. 32 embodiment.

FIG. 32 is a top plan view showing another embodiment of the invention. FIG. 33 is a sectional view taken along the line A—A of FIG. 32. Further, FIG. 34 is a perspective view showing a shape of a reinforcement side plate 60 used in the FIG. 32 embodiment. This embodiment is different from the FIG. 1 embodiment in the following aspects. First, six pieces of the semiconductor image sensor chips 1 are connected together in series. Second, the pair of reinforcement side plates 60 are fixed to widthwise opposite sides of the semiconductor image sensor device by an adhesive 61 of room temperature curing type for improving the mechanical strength as shown in FIG. 33. In contrast to the FIG. 1 embodiment, the present embodiment has a great overall length so that the strength and rigidity of the semiconductor image sensor device is inferior to the FIG. 1 embodiment. Thus, the device may suffer from drawbacks such as deficiency of strength and bending or stress of workpieces. In order to remove these drawbacks, the reinforcement side plate 60 is adopted in this embodiment.

The reinforcement side plate 60 has a length equal to the overall length of the semiconductor image sensor device, and is shaped into a thin and elongated planar piece which is formed with a fitting groove 62 for guiding the side plate 60 in engagement with the semiconductor image sensor chips 1 and driver substrates 3. The fitting groove 62 not only can stabilize widthwise positioning of those components relative to the side plate 60, but also can serve as a container for reserving a sufficient amount of the adhesive to ensure practical adhesion strength. The reinforcement side plate 60 may be composed of a different material than silicon which constitutes those of the sensor chip 1 and driver substrate 3. In view of this, the adhesive 61 may be of the room temperature curing type which can eliminate adverse effects of the thermal expansion difference in the curing process of the adhesive. Though the pair of side plates 60 having the fitting groove 62 are utilized as supplementary reinforcement member in this embodiment such that each side plate 60 is fixed by means of the adhesive 61 of the room temperature curing type, other alternatives may be adopted as follows. First, as far as the reinforcement plate does not affect the light receiving area and does ensure the needed strength, the shape and position of the reinforcement plate is not limited to the disclosed embodiment. Second, instead of using the adhesive for fixing, other method may be adopted such that, for example, the reinforcement side plate may be tightly engaged to the side of the semiconductor image sensor device through the fitting groove to thereby mechanically unite both the parts with each other.

Figure 35:
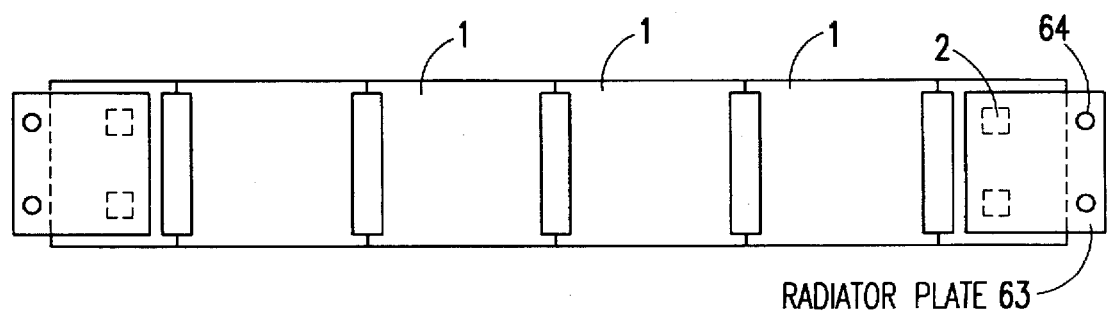
FIG. 35 is a plan view showing another embodiment of the inventive semiconductor image sensor device, attached with a radiator plate.
Figure 36:
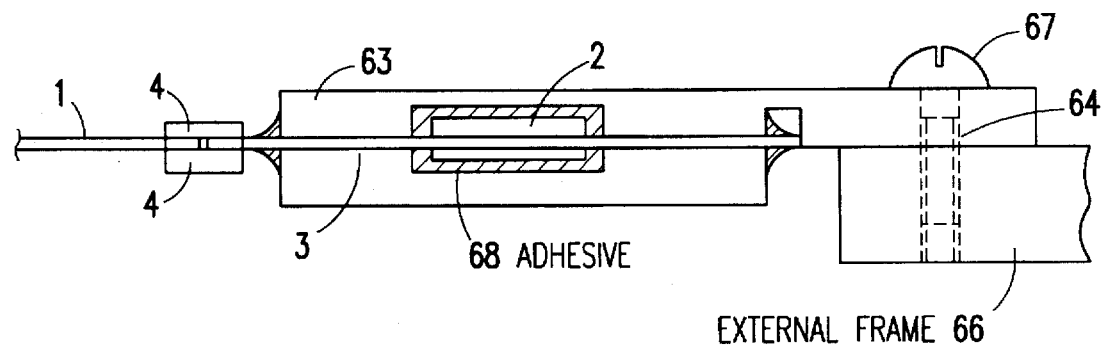
FIG. 36 is an enlarged and detailed section showing an attached portion of the radiator plate in the FIG. 35 embodiment.

FIG. 35 shows a further embodiment of the inventive semiconductor image sensor device. Namely, a radiator plate 63 is attached to the driver substrate 3 for removing heat generated by the driving chips 2 to avoid unstable operation due to increase in temperature. Further, FIG. 36 is an enlarged section showing a portion where the radiator plate 63 is attached to the sensor device and to an external frame 66. The upper radiator plate 63 is fixed to the driver substrate 3 by an adhesive 68 to enclose the semiconductor driving chips 2. The radiator plate 63 is further formed with a hole 64 for fixing the semiconductor image sensor device to the frame 66 by means of a screw 67. Thus, the radiator plate 66 has two functions for radiating heat and for fixing the device to the frame 66 to support the device, thereby reducing the number of components and the number of assembling steps. In the two-face device, other semiconductor driving chips 2 are mounted on the bottom face, hence a lower radiator plate 65 is attached in similar manner. While the upper raidator plate 63 is utilized for the frame attachment, the lower radiator plate 65 has a size slightly smaller than the driver substrate 3. The radiator plate is preferably composed of, for example, aluminum alloy having good thermal conductivity, high strength and high accuracy of dimension. The shape of the radiator plate is determined according to the relation between the heat amount generated by the driving chip 2 and the radiated heat amount, the fitting structure of the frame; the size of the driving chip 2 and driver substrate 3; and positional relation and dimension of an escape portion.

Figure 37:
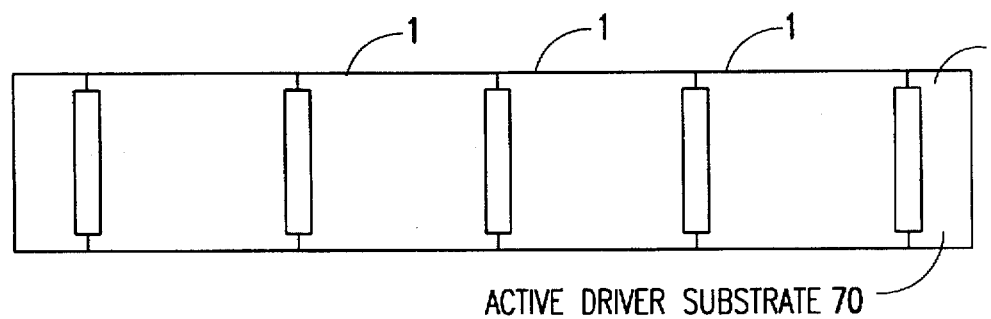
FIG. 37 is a plan view showing still another embodiment utilizing an integrated active driver substrate which is integrated with a semiconductor driving circuit.

FIG. 37 shows a still further embodiment of the inventive semiconductor image sensor device. In this embodiment, the driver substrate is composed of a monosilicon plate formed thereon integrally with active elements for driving the image sensor chips 1. Namely, the active driver substrate 70 is utilized in place of the driver substrate 3 of FIG. 1 which mounts thereon a semiconductor driving chip 2. The active driver substrate 70 is utilized to eliminate a driving chip and to achieve the following advantages. First, chip mount to the driver substrate is eliminated to thereby reduce number of components and number of assembly steps. Further, defects in the chip mount and degradation of coupled portion may be eliminated to thereby improve yield rate and reliability. Second, dimensions of the driver substrate can be designed without regard to a space for chip mount to thereby enable reduction of the substrate size. Third, the radiator plate is attached to cover a step portion on the substrate, thereby eliminating an escape work of the radiator plate to increase the contact area to improve the bonding strength and the heat radiation capacity, and to simplify the shape of the radiator plate.

In modification of the FIG. 37 embodiment, the function of the driving chip may be divided into an external supplementary chip and the driver substrate. Stated otherwise, the driving function is shared by the supplementary chip and the driver substrate. In such a case, integration density of the supplementary chip can be lowered as compared to the complete driving chip of FIG. 1, as well as integration density of the driver substrate can be lowered as compared to that of the complete active driver substrate of FIG. 37, thereby improving yield rate of the respective elements.

Figure 38:
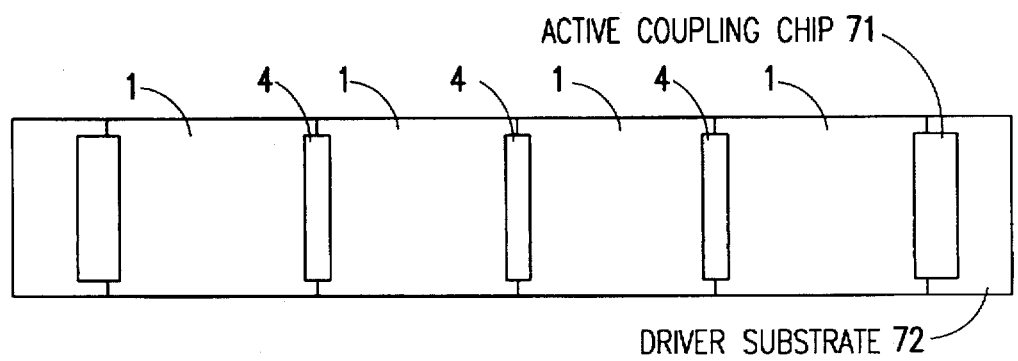
FIG. 38 is a plan view showing a further embodiment where an end coupling chip between the sensor chip and the driver substrate comprises an active coupling chip which is integrated with a driving circuit.

FIG. 38 shows a still further embodiment of the inventive image sensor device. In this embodiment, an active coupling chip 71 formed with a driving circuit is utilized to couple an end sensor chip 1 and a driver substrate 72, thereby eliminating a driving chip from the driver substrate 72. The use of the active coupling chip 71 achieves the following advantages. First, the driving chip can be eliminated to thereby reduce the number of components and the number of assembling steps. Second, layout of the driver substrate can be designed free of a driving chip mount space to thereby reduce the size of the driver substrate. Third, the signal from the sensor chips 1 through the sensing lines is once processed and then transmitted to the driver substrate 72, thereby reducing the number of electrodes formed on the driver substrate 72 to be smaller than the number of the sensing lines. By this, the driver substrate 72 has a broad electrode pitch and a wide electrode area to thereby facilitate and ensure the electrical connection.

In modification of the FIG. 38 embodiment, a supplementary driving chip may be mounted on the driver substrate such that the driving function is shared by the supplementary driving chip and the active coupling chip. Alternatively, the active coupling chip may be combined to the active driver substrate. Further, the active coupling chip may be directly connected to an external system to thereby eliminate a driver substrate.

Figure 39:
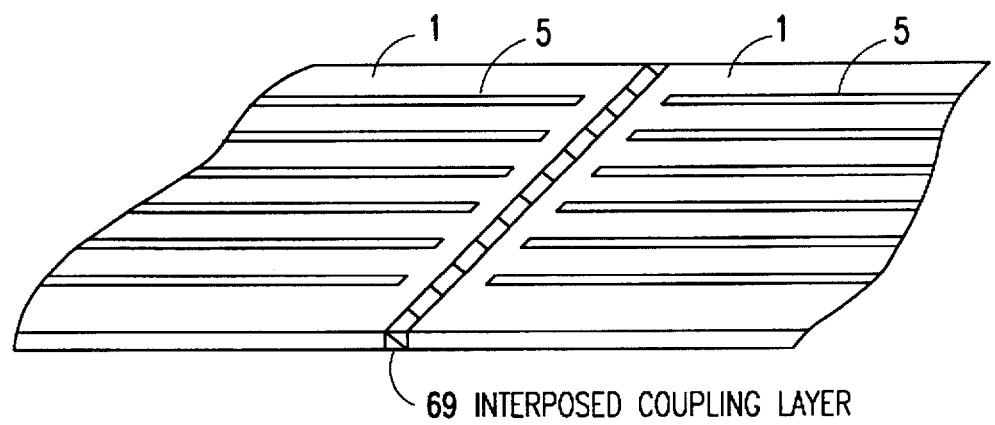
FIG. 39 is a perspective view showing an additional embodiment of the inventive semiconductor image sensor device, where adjacent sensor chips are mechanically united with each other by using a coupling layer.
Figure 40:
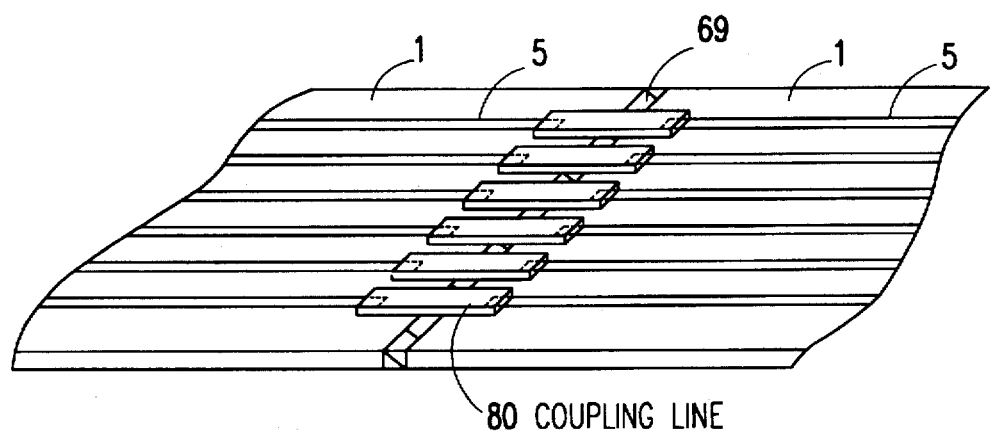
FIG. 40 is a perspective view showing a coupled state of the adjacent image sensor chips through coupling lines in the FIG. 39 embodiment.
Figure 41:
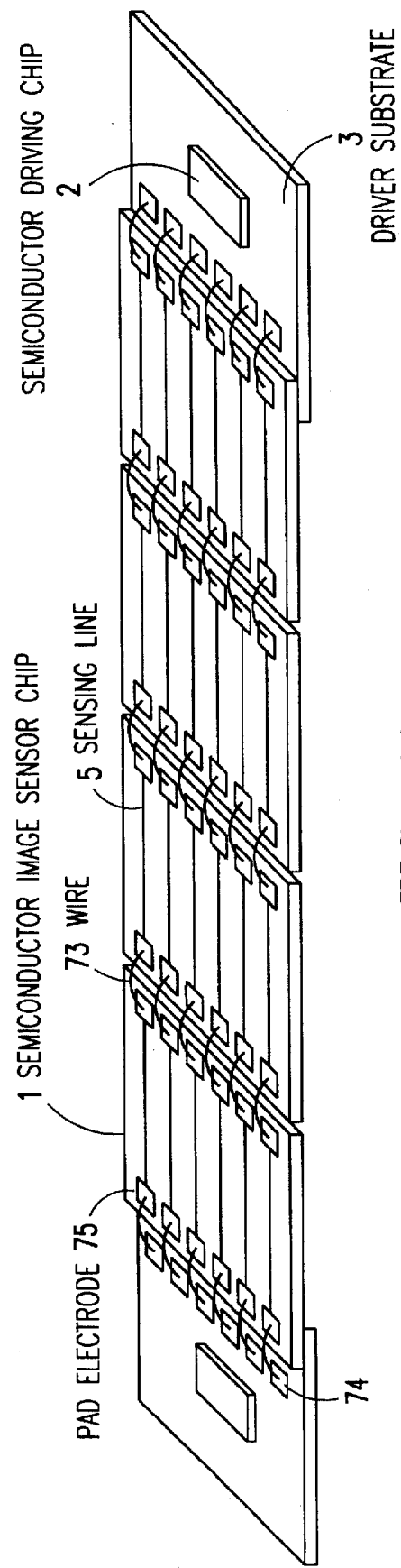
FIG. 41 is a top perspective view showing a conventional semiconductor image sensor device.
Figure 42:
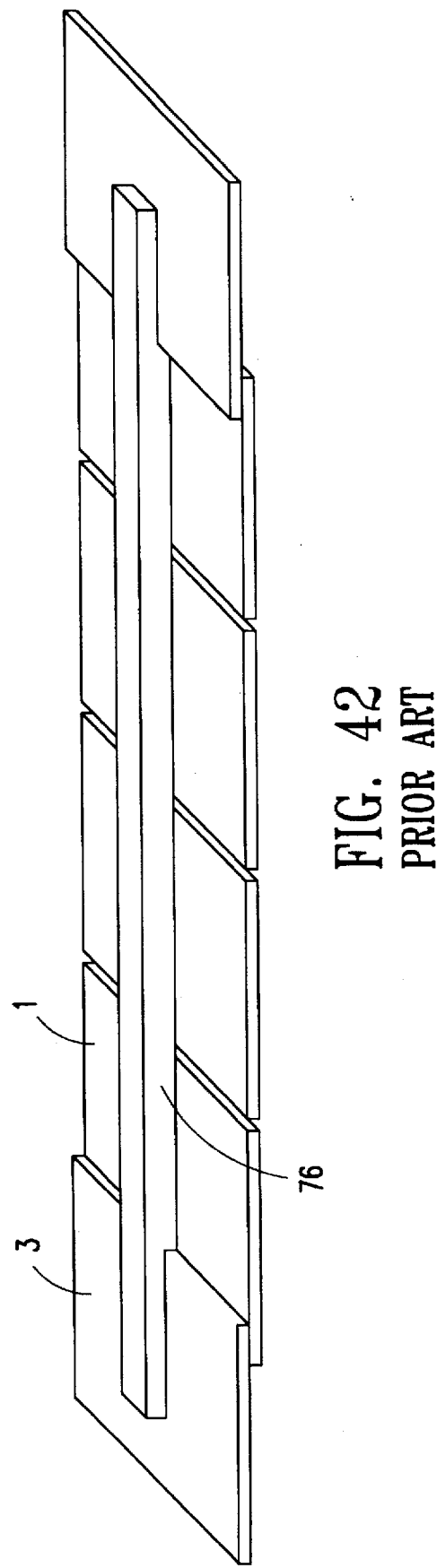
FIG. 42 is a bottom perspective view showing the same conventional semiconductor image sensor device.

In the before-described various embodiments, either monosilicon coupling chip 7 or glass coupling chip 14 is utilized to connect between adjacent sensor chips 1, and between a sensor chip 1 and a driver substrate 3. In contrast, FIGS. 39 and 40 show a still further embodiment of the invention, where a pair of image sensor chips 1 are mechanically coupled to each other by an interposed coupling layer 69. Thereafter, coupling lines 80 are formed across the coupling layer 69 to provide electrical connection between the corresponding sensing lines 5. The coupling lines 80 may be formed by printing an electrically conductive paste, or by blowing such a paste onto a coupling surface by a jet nozzle. In this construction, mechanical and electrical connections between adjacent sensor chips are separated from each other to thereby simplify the device structure and to facilitate repairing of the coupling. This structure may supplement the other structure using the coupling chip.

As described above, in the inventive semiconductor image sensor device, the semiconductor image sensor chips and driver substrates are connected to each other by means of the coupling chips to achieve concurrently the electrical conduction and mechanical strength, thereby advantageously providing the semiconductor image sensor device of the high performance multiple chip mount type having a relatively simple structure which features the mechanical strength and reliability.

What is claimed is:

1. A method of producing a semiconductor device comprised of a plurality of semiconductor chips, a semiconductor driving chip for driving the semiconductor chips, a driver substrate for mounting thereon the semiconductor driving chip, and coupling chips, the method comprising:

the first step of aligning the semiconductor chips and the driver substrate to set relative positions thereof in a common plane;

the second step, performed after the first step, of coupling an adjacent pair of the semiconductor chips with each other and coupling a semiconductor chip and the driver substrate with each other by means of the coupling chips; and the third step of mounting the semiconductor driving chip on the driver substrate.

2. A method of producing a semiconductor device according to claim 1; wherein the second step comprises applying an anisotropic electroconductive adhesive to a coupling portion, and applying heat and pressure to the coupling portion.

3. A method of producing a semiconductor device according to claim 1; wherein the second step comprises utilizing a coupling chip composed of glass for effecting coupling by anodic bonding.

4. A method of producing a semiconductor device according to claim 1; wherein the third step comprises applying an anisotropic electroconductive adhesive to a coupling portion under heat and pressure.

5. A method of producing a semiconductor device according to claim 1; wherein the second step comprises mechanically coupling the semiconductor chips with each other and the semiconductor chip and the driver substrate with each other, and thereafter electrically connecting among the semiconductor chips and the driver substrate.

6. A method of producing a semiconductor device according to claim 5; wherein the second step includes printing an electroconductive material to form electrical connection.

7. A method of producing a semiconductor device according to claim 1; wherein the semiconductor chips comprise semiconductor image sensor chips.

8. A method of producing a semiconductor device according to claim 1 wherein:

each of the semiconductor chips has two opposed edges and a major surface extending between the two opposed edges;

the first step comprises placing one edge of a first one of the semiconductor chips parallel to one edge of a second one of the semiconductor chips; and the second step comprises placing one coupling chip on the major surfaces of the first one and the second one of the semiconductor chips so that the one coupling chip extends between the one edge of the first one of the semiconductor chips and the one edge of the second one of the semiconductor chips.

9. A method of producing a semiconductor device composed of a plurality of semiconductor chips having conductor lines, a semiconductor driving chip for driving the semiconductor chips, a driver substrate for mounting thereon the semiconductor driving chip, and coupling means, the method comprising:

in a first step, aligning the semiconductor chips and the driver substrate and coupling the semiconductor chips and the driver substrate via the coupling means to fix relative positions thereof in a common plane; and in a second step, performed after the first step, forming a coupling line made of electrically conductive paste in order to provide electrical connection between corresponding conductor lines on the semiconductor chips.

10. A method of producing a semiconductor device according to claim 9, wherein said second step comprises blowing the electrically conductive paste onto surface portions of the semiconductor chips.

* * * * *